United States Patent
Watanabe et al.

(10) Patent No.: US 6,794,283 B2
(45) Date of Patent: Sep. 21, 2004

(54) SEMICONDUCTOR DEVICE AND FABRICATION METHOD THEREOF

(75) Inventors: Hiroyuki Watanabe, Bisai (JP); Hideki Mizuhara, Bisai (JP); Shinichi Tanimoto, Bisai (JP); Atsuhiro Nishida, Ogaki (JP); Yoshikazu Yamaoka, Ogaki (JP); Yasunori Inoue, Ogaki (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/320,271

(22) Filed: May 27, 1999

(65) Prior Publication Data

US 2001/0055873 A1 Dec. 27, 2001

(30) Foreign Application Priority Data

May 29, 1998 (JP) .......................... 10-149456
Oct. 29, 1998 (JP) .......................... 10-308754

(51) Int. Cl.$^7$ ........................................ H01L 21/4763
(52) U.S. Cl. ................................. 438/623; 438/783
(58) Field of Search ........................... 438/623, 627, 438/628, 780, 783, 6, 251, 659, 778, 622, 625, 637

(56) References Cited

U.S. PATENT DOCUMENTS

| | | | |
|---|---|---|---|
| 3,747,203 A | 7/1973 | Shannon | ............ 438/629 |
| 4,668,973 A | 5/1987 | Dawson et al. | |
| 4,676,867 A | 6/1987 | Elkins et al. | ............ 156/643 |
| 4,775,550 A | 10/1988 | Chu et al. | ............ 427/38 |
| 4,885,262 A | 12/1989 | Ting et al. | ............ 437/231 |
| 4,920,071 A | 4/1990 | Thomas | |
| 4,962,052 A | 10/1990 | Asayama et al. | ............ 437/31 |
| 4,983,546 A | 1/1991 | Hyun et al. | ............ 437/231 |
| 4,984,055 A | 1/1991 | Okumura et al. | ............ 257/644 |
| 5,003,062 A | 3/1991 | Yen | ............ 437/231 |
| 5,024,723 A | 6/1991 | Goesele et al. | ............ 156/628 |
| 5,084,412 A | 1/1992 | Nakasaki | ............ 437/189 |
| 5,087,589 A | 2/1992 | Chapman et al. | ............ 437/195 |
| 5,106,787 A | 4/1992 | Yen | ............ 437/231 |
| 5,153,680 A | 10/1992 | Naito et al. | ............ 438/687 |
| 5,166,768 A | 11/1992 | Ito | ............ 438/637 |
| 5,186,745 A | 2/1993 | Maniar | ............ 106/287 |
| 5,192,697 A | 3/1993 | Leong | |
| 5,270,259 A | 12/1993 | Ito et al. | ............ 437/235 |

(List continued on next page.)

FOREIGN PATENT DOCUMENTS

| | | |
|---|---|---|
| DE | 42 18 495 | 12/1992 |
| EP | 0 602 607 A1 | 6/1994 |
| JP | 56-125844 | 10/1981 |

(List continued on next page.)

OTHER PUBLICATIONS

"Multilevel–Interconnection Technology for VLSI and ULSI," Silicon Processing for the VLSI Era—vol. II, (pp. 232–233).

(List continued on next page.)

Primary Examiner—Calvin Lee
(74) Attorney, Agent, or Firm—Westerman, Hattori, Daniels & Adrian, LLP

(57) ABSTRACT

A semiconductor device superior in reliability and suitable for microminiaturization is provided. An organic SOG film is formed on a silicon oxide film. Boron ions are implanted into the organic SOG film. By introducing boron ions into the organic SOG film, the organic components in the film are decomposed. Also, the moisture and hydroxyl group included in the film are reduced. After a metal interconnection is embedded in a modified SOG film by the Damascene method, a modified SOG film is formed thereon. Then, contact holes are formed. After a contact hole interconnection is embedded in the contact holes, a modified SOG film and an upper metal interconnection are formed by the Damascene method.

15 Claims, 17 Drawing Sheets

U.S. PATENT DOCUMENTS

| | | | |
|---|---|---|---|
| 5,310,700 A | 5/1994 | Lien et al. | |
| 5,314,834 A | 5/1994 | Mazure et al. | 438/595 |
| 5,314,843 A | 5/1994 | Yu et al. | |
| 5,341,026 A | 8/1994 | Harada et al. | 257/764 |
| 5,352,630 A | 10/1994 | Kim et al. | 437/195 |
| 5,373,192 A | 12/1994 | Eguchi | |
| 5,387,812 A | 2/1995 | Forouhi et al. | |
| 5,404,046 A | 4/1995 | Matsumoto et al. | 257/750 |
| 5,429,990 A | 7/1995 | Liu et al. | |
| 5,459,086 A | 10/1995 | Yang | |
| 5,468,684 A | 11/1995 | Yoshimori et al. | 437/228 |
| 5,479,054 A | 12/1995 | Tottori | 257/752 |
| 5,496,776 A | 3/1996 | Chien et al. | 437/231 |
| 5,514,910 A | 5/1996 | Koyama | 257/768 |
| 5,519,254 A | 5/1996 | Tabara | |
| 5,523,616 A | 6/1996 | Den | |
| 5,541,445 A | 7/1996 | Quellet | |
| 5,549,786 A | 8/1996 | Jones et al. | 156/662.1 |
| 5,569,618 A | 10/1996 | Matsubara | 437/52 |
| 5,581,101 A | 12/1996 | Ning et al. | 257/347 |
| 5,607,880 A | 3/1997 | Suzuki et al. | 437/195 |
| 5,616,513 A | 4/1997 | Shepard | 438/402 |
| 5,665,845 A * | 9/1997 | Allman | 528/8 |
| 5,674,784 A | 10/1997 | Jang et al. | 437/195 |
| 5,702,568 A | 12/1997 | Shin et al. | 156/644 |
| 5,723,895 A | 3/1998 | Takahashi | 257/499 |
| 5,753,975 A | 5/1998 | Matsuno | 257/751 |
| 5,786,273 A | 7/1998 | Hibi et al. | 438/637 |
| 5,817,582 A | 10/1998 | Maniar | 438/782 |
| 5,818,068 A | 10/1998 | Sasaki et al. | |
| 5,830,773 A | 11/1998 | Brennan et al. | 437/67 |
| 5,855,962 A | 1/1999 | Cote et al. | 427/376 |
| 5,863,702 A * | 1/1999 | Ohbayashi et al. | 430/270.13 |
| 5,866,476 A | 2/1999 | Choi et al. | 438/624 |
| 5,892,269 A | 4/1999 | Inoue et al. | 257/634 |
| 5,898,221 A * | 4/1999 | Mizuhara et al. | 257/751 |
| 5,930,624 A | 7/1999 | Murata et al. | 438/253 |
| 5,960,321 A * | 9/1999 | Hsieh et al. | 438/699 |
| 5,963,827 A | 10/1999 | Enomoto et al. | 438/629 |
| 6,001,745 A | 12/1999 | Tu et al. | |
| 6,013,578 A | 1/2000 | Jun | 438/687 |
| 6,071,807 A * | 6/2000 | Watanabe et al. | 438/623 |
| 6,071,810 A * | 6/2000 | Wada et al. | 438/635 |
| 6,136,686 A * | 10/2000 | Gambino et al. | 438/624 |
| 6,153,519 A * | 11/2000 | Jain et al. | 438/681 |

FOREIGN PATENT DOCUMENTS

| | | |
|---|---|---|
| JP | 58-031519 | 2/1983 |
| JP | 59-017243 | 1/1984 |
| JP | 62-060242 | 3/1987 |
| JP | 63 198359 | 8/1988 |
| JP | 01-199456 | 8/1989 |
| JP | 01-307247 | 12/1989 |
| JP | 02-007451 | 1/1990 |
| JP | 02-026055 | 1/1990 |
| JP | 02-101532 | 8/1990 |
| JP | 02-235358 | 9/1990 |
| JP | 02-253643 | 10/1990 |
| JP | 03-101130 | 4/1991 |
| JP | 04-234149 | 8/1992 |
| JP | 04-307934 A | 10/1992 |
| JP | 04-317358 | 11/1992 |
| JP | 05-074963 | 3/1993 |
| JP | 05-198523 | 8/1993 |
| JP | 5-226334 | 9/1993 |
| JP | 06-275229 | 9/1994 |
| JP | 6-291202 | 10/1994 |
| JP | 06-349950 | 12/1994 |
| JP | 07-099195 | 4/1995 |
| JP | 08-017770 | 1/1996 |
| JP | 08-064561 | 3/1996 |
| JP | 08-241891 | 9/1996 |
| JP | 9-58062 | 3/1997 |
| JP | 9-69562 | 3/1997 |
| JP | 9-246375 | 9/1997 |
| JP | 9-312339 | 12/1997 |
| JP | 09-330982 | 12/1997 |
| JP | 10-209147 | 8/1998 |
| JP | 10-303295 | 11/1998 |
| KR | 0179563 | 11/1998 |

OTHER PUBLICATIONS

"Lithography I: Optical Resist Material and Process Technology," (pp. 441).

1995 Proceedings 12th International VLSI Multilevel Interconnection Conference (VMIC Catalog No. 95ISMIC—104), Jun. 27–29, 1995.

Wang, et al., "A Study of Plasma Treatments on Siloxane SOB," IEEE VMIC Conference, Jun. 7–8, 1994, pp. 101–107.

Chiang, et al., "Defencts Study on Spin on Glass Planarization Technology," IEEE VMIC Conference, Jun. 15–16, 1987, pp. 404–412.

Lai–Juh Chen, et al., "Flourine–Implanted Treatment (FIT) SOG for the Non–Etchback Intermetal Dielectric," IEEE VMIC Conference, Jun. 7–8, 1994, pp. 81–86.

Moriya, et al., "Modification Effects in Ion–Implanted $SiO_2$ Spin–on–Glass," Journal of Electrochem. Soc., vol. 140, No. 5, May 1993, pp. 1442–1450.

Matsuura, et al., "An advance Interlayer Dielectric System with Partially Converted Organic SOG Using Plasma Treatment," IEEE VMIC Conference, Jun. 8–9, 1993, pp. 113–115.

Ishida, et al., "Mechanism for ALSiCu Alloy Corrosion," Japanese Journal of Applied Physics, vol. 31 (1992), pp. 2045–2048.

Doki, et al., "Moisture–Blocking Mechanism of ECR––Plasma," IEEE VMIC Conference, Jun. 7–8, 1994, pp. 235–239.

Shimokawa, et al., "Suppression of MOSFET Hot Carrier Degradation by P–SiO Underlayer," The Institute of Electronics, Information and Communication Engineers, Techinal Report of IEICE, SDM92–133 (Dec. 1992), pp. 89–94.

Murase, et al., "Dielectric Constant of Silicon Dioxide Deposited by Atmospheric–Pressure Chemical Vapor Deposition Using Tetraethylorthosilicate and Ozone," Japanese Journal of Applied Physics, vol. 33, (1994), pp. 1385–1389.

Sze, S.M, "Physics of Semiconductor Device Second Edition", p. 393, 1981.

Wolf et al. "Silicon Processing for the VLSI Era: vol. I—Process Technology," Lattice Press, 1986 p. 441.

Office Action of Japanese Application No. 09–234456.

OFFICE Action of JAPanese Application No. 08–181593.

Office Action of Japanese Applicarion No. 09–204942.

Office Action of Japanese Application No. 08–345587.

Office Action Of Japanese Application No. 09–012788.

Office Action of Japanese Application No. 07–227294.

* cited by examiner

SEMICONDUCTOR DEVICE AND FABRICATION METHOD THEREOF

BACKGROUND OF THE INVENTION

1. Field of the Invention

The present invention relates to a semiconductor device and a method of fabricating the same.

2. Description of the Background Art

In the past several years, intensive efforts have been taken to reduce the size of interconnections and provide multilayers for the purpose of further increasing the integration density of semiconductor integrated circuit devices. An interlayer insulation film is provided between each interconnection to obtain a multilayer structure of the interconnection. If the surface of this interlayer insulation film is not planar, a step-graded portion will be generated at the interconnection formed above the interlayer insulation film. This will cause defects such as disconnection. Therefore, the surface of the interlayer insulation film (the surface of the device) must be made as flat as possible. The technique to planarize the surface of the device is called planarization. This planarization technique has become ever important in reducing the size and providing multilayers of the interconnection.

In planarization, an SOG (Spin-On-Glass) film is known as an interlayer insulation film that is generally used. Recently, development in the planarization technique talking advantage of the flow of the interlayer insulation film material is particularly noticeable.

An "SOG" is the generic term of a film mainly composed of a solution in which a silicon compound is dissolved in an organic solvent, and silicon dioxide formed from that solution.

In forming an SOG film, first a solution having a silicon compound dissolved in an organic solvent is applied in droplets on a rotated substrate. By this rotation, the solution coating is provided so as to alleviate the step-graded portion on the substrate corresponding to the interconnection. More specifically, the coating is formed thick at the concave portion and thin at the convex portion on the substrate. As a result, the surface of the solution coating is planarized.

Then, heat treatment is applied to vaporize the organic solvent. Also, polymerization proceeds to result in a planarized SOG film at the surface.

An SOG film is typically classified into an inorganic SOG film that does not include any organic component in a silicon compound, as represented by the following general formula (1), and an organic SOG film including an organic component in a silicon compound, as represented by the following general formula (2).

$$[SiO_2]_n \quad (1)$$

$$[R_xSi_yO_z]_n \quad (2)$$

(n, X, Y, Z: integer; R: alkyl group or aryl group)

Inorganic and organic SOG films have superior flatness. However, the inorganic SOG film includes a great amount of moisture and hydroxyl group. Therefore, it may adversely affect the metal interconnection and the like. There is the possibility of inducing problems such as degradation in electrical characteristics as well as corrosion. A similar, though less susceptible, problem is seen in an organic SOG film. This is because the organic SOG film includes some amount of moisture and hydroxyl group.

To compensate for this disadvantage when an SOG film is employed as an interlayer insulation film, an insulation film such as a silicon oxide film formed by, for example, plasma CVD, having the characteristics of insulation and mechanical strength in addition to the property of blocking moisture and hydroxyl group is provided between the SOG film and the metal interconnection (refer to Japanese Patent Laying-Open No. 5-226334, for example).

The provision of an insulation film such as a silicon oxide film formed by plasma CVD as in the conventional case between an SOG film and a metal interconnection will limit the decrease between the patterns of the underlying metal interconnection to bar the microminiaturization of the elements.

SUMMARY OF THE INVENTION

An object of the present invention is to provide a semiconductor device of superior reliability and suitable for microminiaturization, and a method of fabricating such a semiconductor device.

A method of fabricating a semiconductor device according to the present invention includes the steps of forming a first insulation film on a substrate, introducing impurities into the first insulation film, and embedding and forming a first conductive layer in the first insulation film. In a preferable embodiment, the step of forming a first conductive layer includes the step of embedding the first conductive layer in the first insulation film so that the surface of the first conductive layer is exposed. The method of this preferable embodiment further includes the steps of forming a second insulation film on the first insulation film, forming a contact hole in the second insulation film to expose a portion of the first conductive layer, and forming a second conductive layer in the contact hole, electrically connected to the first conductive layer. This method further desirably includes the step of introducing impurities into the second insulation film.

Another method of a preferable embodiment includes, after formation of the second insulation film and before formation of the contact hole, the steps of forming a first mask pattern on the second insulation film, forming a third insulation film on the second insulation film and on the first mask pattern, forming a second mask pattern having an opening larger than the first mask pattern on the third insulation film, etching the third insulation film using the second mask pattern to form a trench in the third insulation film arriving at the first mask pattern. In this method, the step of forming a contact hole includes the step of etching the second insulation film using the first mask pattern, and the step of forming a second conductive layer includes the step of forming a third conductive layer electrically connected to the second conductive layer in the trench, in addition to the formation of the second conductive layer.

Preferably, this method further includes the step of introducing impurities into the third insulation film.

A further method of a preferable embodiment further includes the step of forming a fourth insulation film on the substrate, prior to formation of the first insulation film. In this method, the step of introducing impurities into the first insulation film is carried out under the condition where the impurities arrive at the interface between the first insulation film and the fourth insulation film.

Preferably, the first insulation film includes a silicon oxide film containing at least 1% of carbon. Also preferably, the second insulation film includes a silicon oxide film containing at least 1% of carbon. Also preferably, the third insulation film includes a silicon oxide film containing at least 1% of carbon. Also preferably, the first insulation film includes an inorganic SOG film.

A still another method of a preferable embodiment includes, after formation of the second insulation film and before formation of a contact hole, the steps of forming a third mask pattern on the second insulation film, etching the second insulating film using the third mask pattern to selectively reduce the thickness of the second insulation film, and forming a fourth mask pattern on the second insulation film so as to expose a portion of the region reduced in thickness. In this method, the method of forming a contact hole includes the step of etching the second insulation film using the fourth mask pattern. The step of forming the second conductive layer includes the step of forming a third conductive layer electrically connected to the second conductive layer on the region that is reduced in thickness, in addition to the formation of the second conductive layer.

Yet a further method of a preferable embodiment includes the steps of forming a second insulation film on the first insulation film, forming a fifth mask pattern on the second insulation film, etching the second insulation film using the fifth mask pattern to form a contact hole in the second insulation film so as to expose a portion of the first conductive layer, forming a resist film in the contact hole and on the second insulation film after the fifth mask pattern is removed, patterning the resist film on the second insulation film to form a sixth mask pattern on the contact hole having an opening larger than the contact hole, etching the second insulation film using the sixth mask pattern to selectively reduce the thickness of the second insulation film, removing the resist pattern remaining in the contact hole and the sixth mask pattern, and forming a second conductive layer electrically connected to the first conductive layer in the contact hole.

In a preferable embodiment, the method further includes the step of introducing impurities into the second insulation film prior to formation of the contact hole in the second insulation film.

By introducing impurities into the first insulation film, the second insulation film and the third insulation film, respective films are modified in nature so that the moisture and hydroxyl group included in the films are reduced. Also, the film becomes less hygroscopic. Accordingly, the insulative property of the insulation film can be improved.

Particularly, by introducing impurities into the first, second, and third insulation films prior to formation of the first interconnection (conductive layer), the second interconnection (conductive layer) and the third interconnection (conductive layer), respectively, the impurities can be implanted to a depth substantially uniform over the entire film. Respective films can be modified uniformly.

By forming a fourth insulation film under the first insulation film in advance and introducing impurities into the first insulation film under the condition where the impurities reach the interface between the first and fourth insulation films, the intensity of adherence between the first insulation film and the fourth insulation film can be improved.

A semiconductor device according to the present invention includes a first conductive layer having a top face on a first plane, a first insulation layer introduced with impurities and having a top face on a second plane parallel to the first plane, a second insulation layer introduced with impurities and having a top face on a third plane parallel to the second plane, a second conductive layer embedded in the first insulation layer, and having a bottom in contact with the top face of the first conductive layer and a top face located on the second plane, and a third conductive layer embedded in the second insulation film, having a bottom in contact with the top face of the second conductive layer, and a top face located on the third plane.

In one embodiment, the second conductive layer and the third conductive layer are a single layer formed continuously.

In another embodiment, the first insulation layer and the second insulation layer are a single layer formed continuously. The second conductive layer and the third conductive layer are a single layer formed continuously.

Preferably, each of the first and second insulation layers includes an SOG film into which impurities are introduced by ion implantation.

In one embodiment, each of the first and second insulation layers includes a silicon nitride film on an SOG film.

In a preferable embodiment, a first conductive layer is embedded in a planarized insulation layer. Preferably, the insulation layer includes an SOG film into which impurities are introduced by ion implantation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
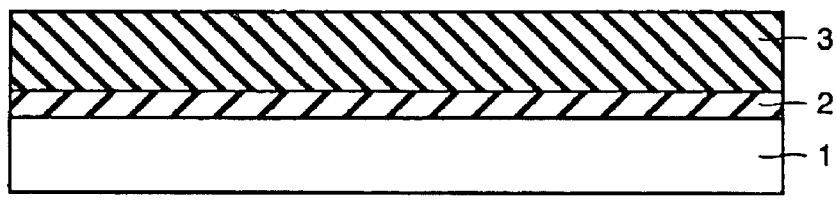
FIGS. 1–9 are schematic sectional views of a semiconductor device according to a first embodiment of the present invention indicating fabrication steps thereof.
Figure 2:
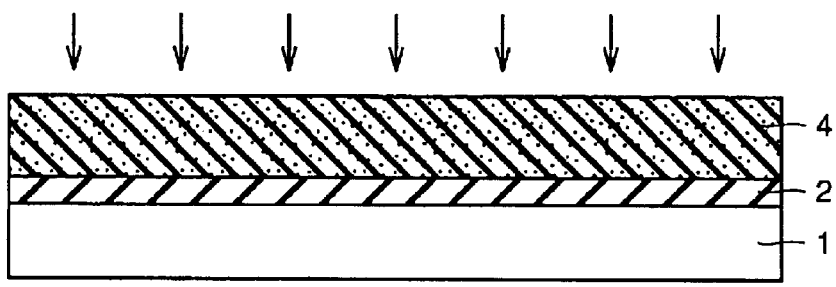
Figure 3:
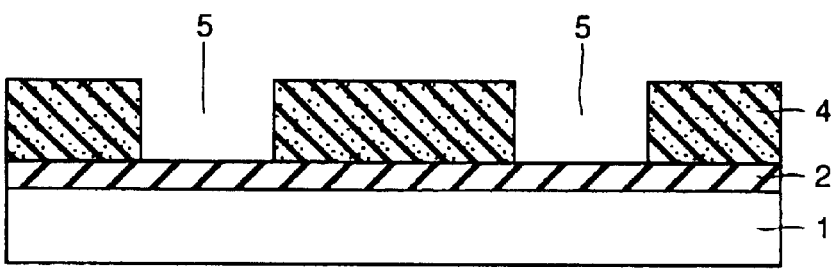
Figure 4:
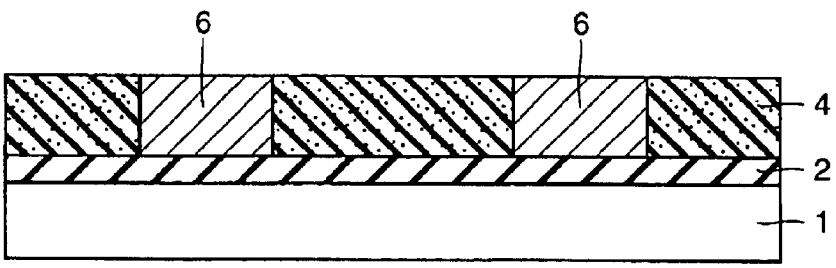
Figure 5:
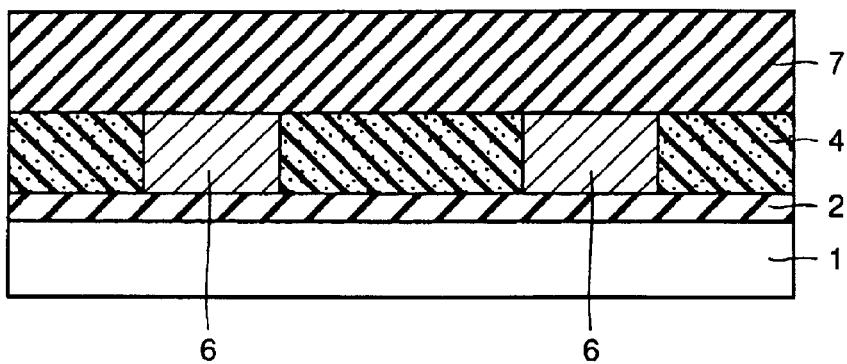
Figure 6:
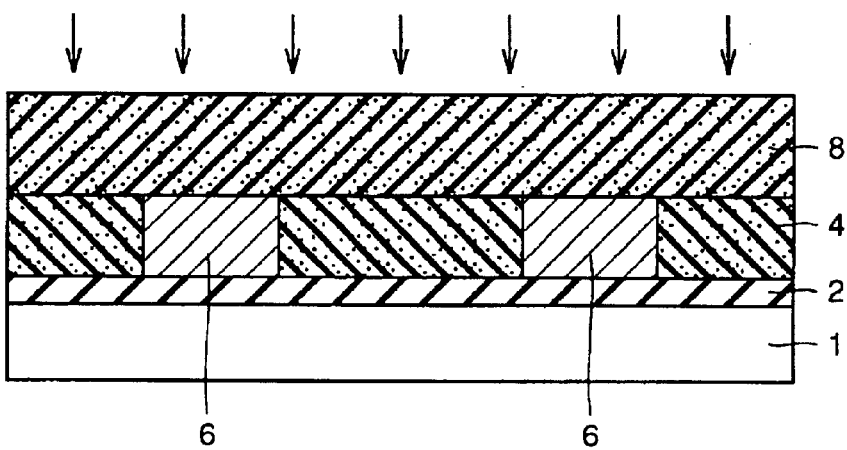
Figure 7:
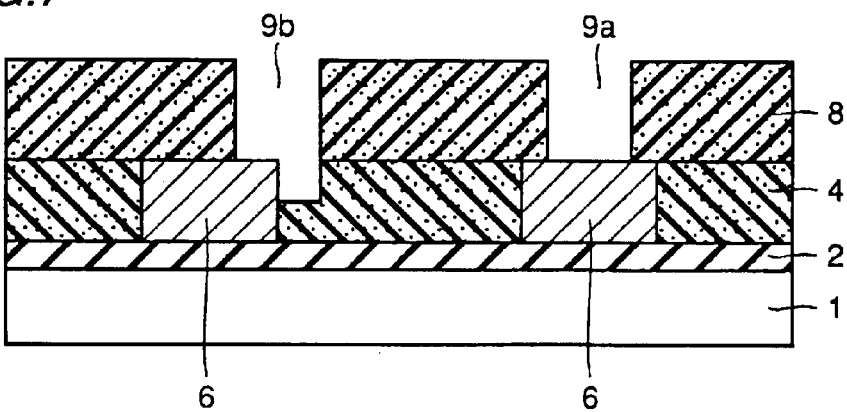
Figure 8:
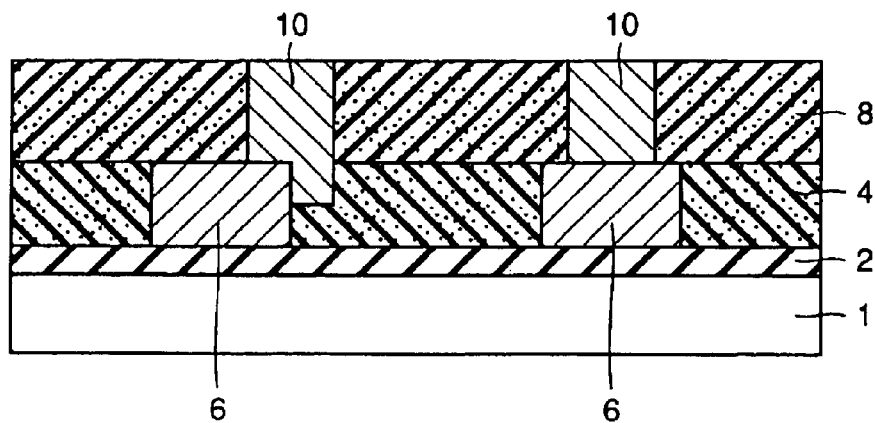
Figure 9:
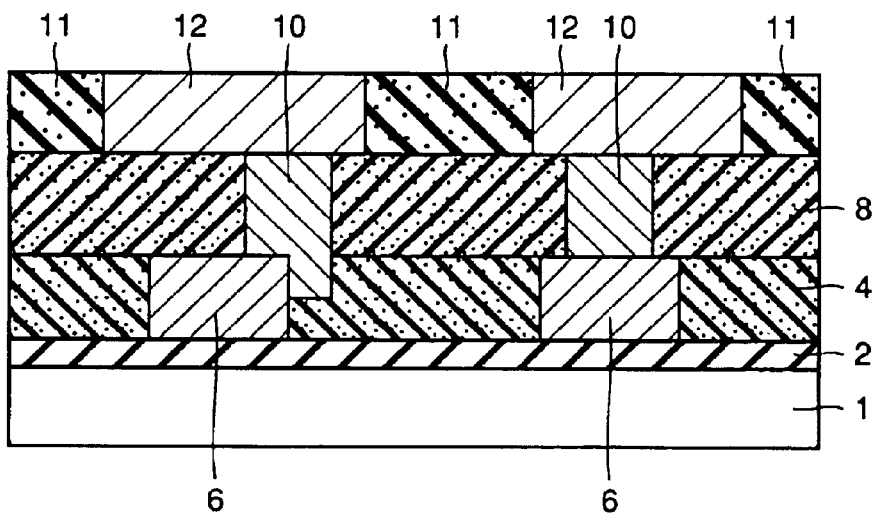

A method of fabricating a semiconductor device according to a first embodiment of the present invention will be described hereinafter with reference to FIGS. 1–9.

In the first step (refer to FIG. 1), a silicon oxide film 2 (film thickness: 200 nm) is formed on a (100) p type (or n type) single crystal silicon substrate 1. An organic SOG film 3 is formed on silicon oxide film 2. Organic SOG film 3 has the composition of $[(CH_3)_2Si_4O_7]_n$, and a film thickness of 600 nm. Silicon oxide film 2 corresponds to the fourth insulation film of the present invention. Organic SOG film 3 corresponds to the first insulation film of the present invention.

Silicon oxide film 2 is formed by plasma CVD. As the reaction gas, monosilane and nitrous oxide ($SiH_4+N_2O$), monosilane and oxygen ($SiH_4+O_2$), TEOS (Tetra-ethoxy-silane) and oxygen ($TEOS+O_2$) and the like are used. The temperature of film growth is 300–900° C.

Silicon oxide film 2 can be formed by a method other than plasma CVD (atmospheric pressure CVD, low pressure CVD, ECR plasma CVD, photo excitation CVD, TEOS-CVD, PVD, etc.). For example, the gas used in atmospheric pressure CVD is monosilane and oxygen ($SiH_4+O_2$), and the temperature of film growth is not more than 400° C. The gas used in reduced pressure CVD is monosilane and nitrous oxide ($SiH_4+N_2O$). The temperature of film growth is not more than 900° C.

The method of forming organic SOG film 3 is set forth in the following. First, an alcohol based solution of a silicon compound of the above composition (for example, IPA+Acetone) is applied on a substrate 1 in droplets that is rotated for 20 seconds at the rotational speed of 2300 rpm. Thus, a coating of the alcohol based solution is provided on substrate 1. Here, the alcohol based solution coating is formed thick at the concave portion and thin at the convex portion with respect to the step-graded portion on substrate 1 to alleviate the unevenness. As a result, the surface of the alcohol based solution coating is made planar.

Then, heat treatment of 100° C. for 1 minute, 200° C. for 1 minute, 300° C. for 1 minute, 22° C. for 1 minute, and 430° C. for 30 minutes are sequentially carried out in an atmosphere of nitrogen, whereby the alcohol based solution is vaporized and polymerization proceeds. An organic SOG film of approximately 300 nm in thickness with a flat surface is formed. By repeating the process of forming a coating to the heat treatment one more time, an organic SOG film 3 of 600 nm in thickness is obtained.

Since the underlying face is planer, this organic SOG film 3 is applied at substantially uniform thickness over the entire plane of the substrate. Organic SOG film 3 is a silicon oxide film containing at least 1% of carbon.

At the second step (refer to FIG. 2), boron ions ($B^+$) are doped into organic SOG film 3 under the condition of an acceleration energy of 140 KeV and dose of $2\times10^{15}$ atoms/$cm^2$. By implanting ions under such a condition, boron ions arrive at the interface between organic SOG film 3 and silicon film 2.

By introducing boron ions into organic SOG film 3 in the above-described manner, the organic component in the film is decomposed. The moisture and hydroxyl group included in the film are reduced. Furthermore, the intensity of adherence between organic SOG film 3 and silicon oxide film 2 is improved by introducing the boron ions to the interface. As a result, organic SOG film 3 is modified to a SOG film 4 (referred to as "modified SOG film" hereinafter) with no organic component and with little moisture and hydroxyl group, and having high adhesion with the underlying film (silicon oxide film 2). Since organic SOG film 3 is substantially uniform in film thickness over the entire face of the substrate, the entire organic SOG film 3 is modified uniformly. Also, the adhesion with the underlying film is improved over the entire face. It is to be noted that this modified SOG film 4 is a silicon oxide film containing at least 1% of carbon.

At the third step (refer to FIG. 3), anisotropic etching is carried out with a resist pattern (not shown) as a mask and using a fluoro carbon type gas as the etching gas to form a trench 5 in modified SOG film 4.

At the fourth step (refer to FIG. 4), the interior of trench 5 is cleaned by sputter etching using inert gas (for example, Ar). Then, a TiN film functioning as an adhesion layer and barrier layer is formed using magnetron sputtering or CVD within trench 5 and on modified SOG film 4. Then, a Cu film is formed thereon by CVD or plating. The surface of the Cu film is polished by CMP (Chemical Mechanical Polishing). A metal interconnection 6 formed of TiN and Cu is embedded in trench 5. This technique of embedding a metal interconnection is generally referred to as the Damascene method.

By virtue of the superior coverage of the organic SOG film, the organic SOG can be filled sufficiently between metal interconnections 6 even if organic SOG film 3 is applied after forming the pattern of metal interconnection 6 in the first to fourth steps, for example. However, when an organic SOG film is applied on an uneven surface such as the underlying interconnection pattern, the film thickness of organic SOG film 3 may vary depending on whether there is an interconnection thereunder or not. If ion implantation is carried out to modify the organic SOG film in such a state, the lower layer portion of the organic SOG film will include a portion that is modified and a portion that is not modified. This will induce various problems that will be described afterwards.

In the present embodiment, organic SOG film 3 is formed on a flat underlying face prior to formation of metal interconnection 6. Therefore, the film thickness of organic SOG film 3 is substantially uniform. The entire organic SOG film 3 is modified substantially uniformly.

At the fifth step (refer to FIG. 5), an organic SOG film 7 of 600 nm in film thickness is formed on modified SOG film 4 and metal interconnection 6. The composition and fabrication method of organic SOG film 7 are similar to those of the above-described organic SOG film 3. Organic SOG film 7 corresponds to the second insulation film of the present invention.

At the sixth step (refer to FIG. 6), boron ions are doped into organic SOG film 7 under the condition of an acceleration energy of 140 KeV and dose of $2\times10^{15}$ atoms/$cm^2$, whereby organic SOG film 7 is modified (referred to as modified SOG film 8 hereinafter), similar to modified SOG film 4. Ion implantation at such a condition allows the boron ions to arrive at the interface between organic SOG film 7 and modified SOG film 4.

Since organic SOG film 7 is substantially uniform in film thickness over the entire face of the substrate, the entire organic SOG film 7 is modified substantially uniformly.

At the seventh step (refer to FIG. 7), anisotropic etching is carried out with a resist pattern (not shown) as a mask, using a fluoro carbon type gas as the etching gas, whereby contact holes 9a, 9b communicating with metal interconnection 6 are formed in modified SOG film 8. Here, contact error will not occur even when a contact hole is formed deviated from the top face of metal interconnection 6, such as contact hole 9b, due to mask misalignment.

In the case where there is a portion not modified in the film (particularly, the lower layer portion) due to insufficient ion implantation into organic SOG film 3 and a contact hole is formed in deviation in that non-modified portion, that non-modified portion may shrink during the oxygen plasma ashing process carried out to remove the photo resist used as an etching mask in the contact hole formation step. As a result, a recess will be generated in the hole. There is a possibility of contact error caused by insufficient embedding of the connection hole interconnection in the hole.

If a non-modified portion of the organic SOG film is exposed in the contact hole, $H_2$) and $CH_3$ will desorb from the organic SOG when Cu is to be formed by CVD in the contact hole. The source gas to form Cu will not be able to enter the contact hole sufficiently. There is a possibility that the Cu of an improper shape will be formed within the contact hole.

In the present embodiment, the entire organic SOG film 3 is modified substantially uniformly as described above. Only a modified portion will be exposed if the contact hole is formed in deviation.

At the eighth step (refer to FIG. 8), the interior of contact holes 9a and 9b are cleaned by sputter etching using inert gas (for example Ar). Then, a TiN film serving as an adhesion layer and a barrier layer is formed on modified SOG film 8 including contact holes 9a and 9b by magnetron sputtering or CVD. A Cu film is formed thereon by CVD or plating. Then, the surface of the Cu film is polished by CMP. Finally, a connection hole interconnection 10 formed of TiN and Cu is embedded in contact holes 9a and 9b.

At the ninth step (refer to FIG. 9), the oxide film and the like at the surface of connection hole interconnection 10 are removed, as necessary by sputter etching using inert gas (for example Ar).

Then, on modified SOG film 8 and connection hole interconnection 10, a modified SOG film 11 and an upper metal interconnection 12 (a multi layer of TiN and Cu) embedded in modified SOG film 11 and electrically connected with connection hole interconnection 10 are formed, similar to the previous first to fourth steps.

Since boron ions are introduced to the interface between organic SOG film 3 and silicon oxide film 2 as described above in the ion implantation process, modified SOG film 4 is less easily peeled off from silicon oxide film 2.

Table 1 shows the verified results using a tensile tester of the adhesion intensity between an SOG film and a silicon oxide film for a test device having an SOG film (film thickness 600 nm) formed on a silicon oxide film. Four types of SOG films were provided as shown in Table 1. Ten samples were provided for each type. The film peel off rate was determined by carrying out a tension test at the tensile force of 500 Kg/cm$^2$ to observe how many of the samples exhibited peel off.

TABLE 1

| Condition | Film Peel Off Rate |
| --- | --- |
| Organic SOG film | 100% |
| Low-pressure Oxygen Plasma Treatment | 100% |
| Modified SOG film (Ar Ion Implantation) | 0% |
| Modified SOG film (B Ion Implantation) | 0% |

The condition column in Table 1 corresponds to those used as an SOG film. The low-pressure oxygen plasma process implies that an organic SOG film is exposed to oxygen plasma. The modified SOG film is formed under the conditions identical to those of the present embodiment. It is appreciated that, by employing a modified SOG film as the SOG film, the adhesion with the underlying silicon oxide film is improved to prevent the film from peeling off.

Figure 10:
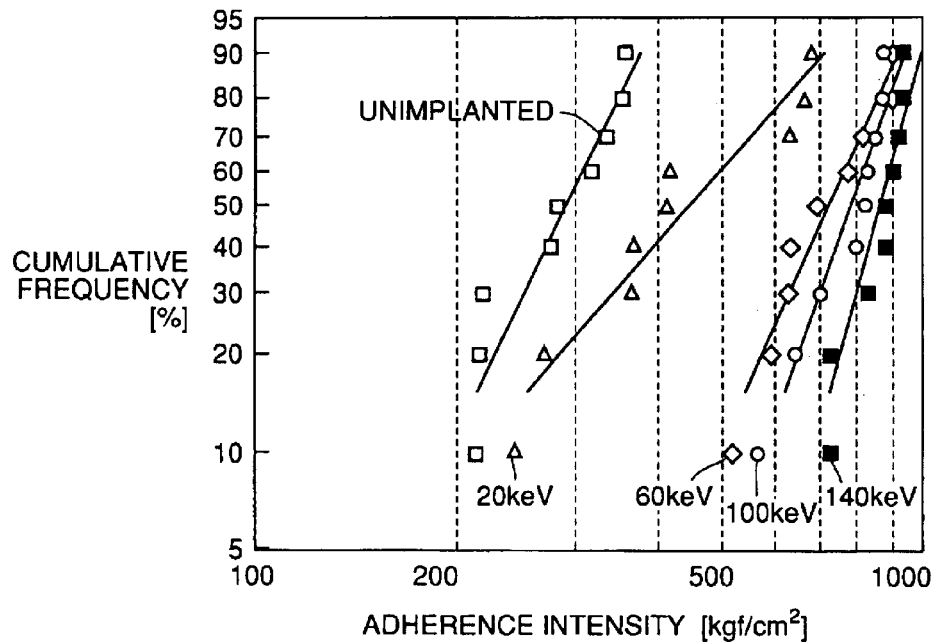
FIG. 10 is a diagram of characteristics for describing an embodiment of the present invention, indicating the relationship between cumulative frequency and adherence intensity.

FIG. 10 shows the adherence intensity when boron ($B^+$) ions are implanted under different conditions to the SOG film in the test device similar to that of Table 1. The dose was set to a constant value of $1 \times 10^{15}$ atoms/cm$^2$. The acceleration energy was varied to 20, 60, 100 and 140 KeV. The label "UNIMPLANTED" in the drawing implies that the film is not subjected to ion implantation, i.e., an organic SOG film.

Those not subjected to ion implantation have low adherence intensity between the SOG film and the silicon oxide film to be easily peeled off. Those subjected to ion implantation have a higher adherence intensity as the acceleration energy is increased. Particularly, an adherence intensity exceeding 700 Kgf/cm$^2$ can be obtained when the acceleration energy is 60 KeV or above. This improvement in adhesion could be attributed to the arrival of the ions at the interface between the SOG film and the silicon oxide film to cause mixing and recombination of the elements at the interface.

Modified SOG films 4, 8 and 11 hardly shrink during the oxygen plasma ashing process carried out to remove the photo resist used as the etching mask. No recess will be generated in the formation of trench 5 and contact holes 9a and 9b. It is therefore possible to embed metal interconnection 6 and connection hole interconnection 10 sufficiently in trench 5 and contact holes 9a and 9b.

Figure 11:
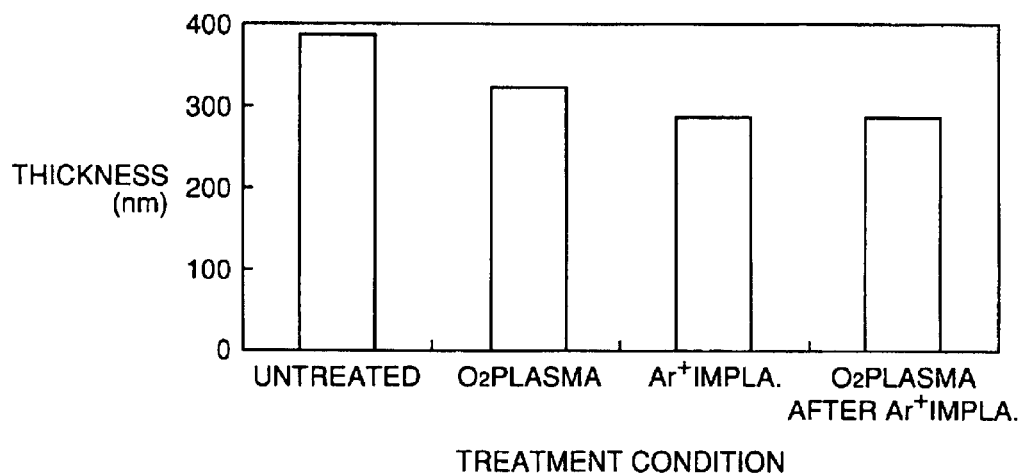
FIG. 11 is a diagram of characteristics for describing an embodiment of the present invention, indicating the relationship between the processing condition and film thickness.

The modified SOG film is also superior in oxygen plasma resistance. FIG. 11 shows, as an index of oxygen plasma resistance, change in the film thickness when the modified SOG film formed by implanting argon (Ar) ions into the organic SOG film is exposed to oxygen plasma for the evaluation of reduction in the film thickness of the modified SOG film. Ions were implanted under the condition of an acceleration energy of (140 KeV and dose of $1 \times 10^{15}$ atoms/cm$^2$.

When the organic SOG film was subjected to oxygen plasma (oxygen plasma process), the film thickness was reduced 16% than the initial film thickness of the organic SOG film (untreated). When the modified SOG film was subjected to oxygen plasma (oxygen plasma process after Ar ion implantation) there was almost no reduction in the film thickness compared to that of the initial modified SOG film (Ar ion implantation). However, the film thickness of the modified SOG film is reduced 25% in comparison to that of the organic SOG film.

From the above results, it is appreciated that the modified SOG film is superior in oxygen plasma resistance.

Figure 12:
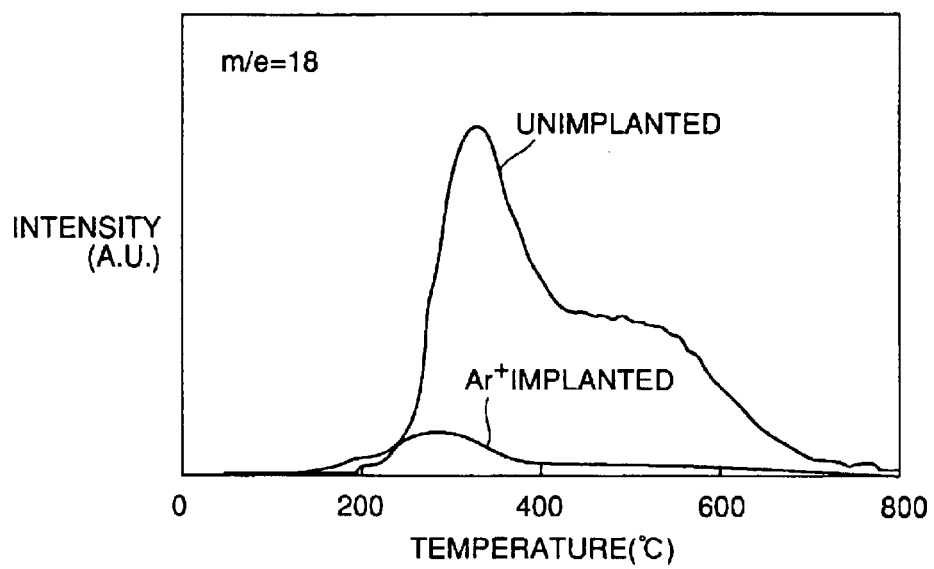
FIG. 12 is a diagram of characteristics for describing an embodiment of the present invention, indicating the relationship between temperature and intensity.

FIG. 12 shows the results of evaluation using the TDS method (Themal Desorption Spectroscopy) applying heat treatment for 30 minutes in an atmosphere of nitrogen to an organic SOG film (unimplanted) and a modified SOG film (Ar ion implantation). The ions were implanted under the conditions of an acceleration energy of 140 KeV and a dose of $1 \times 10^{15}$ atoms/cm$^2$.

The chart represents the amount of desorption as to $H_2O$ (m/e=18). It is appreciated from FIG. 12 that the modified SOG film exhibits little desorption as to $H_2O$ (m/e=18). This means that the moisture and hydroxyl group included in the organic SOG film are reduced by implanting ions to the organic SOG film to obtain a modified SOG film.

Figure 13:
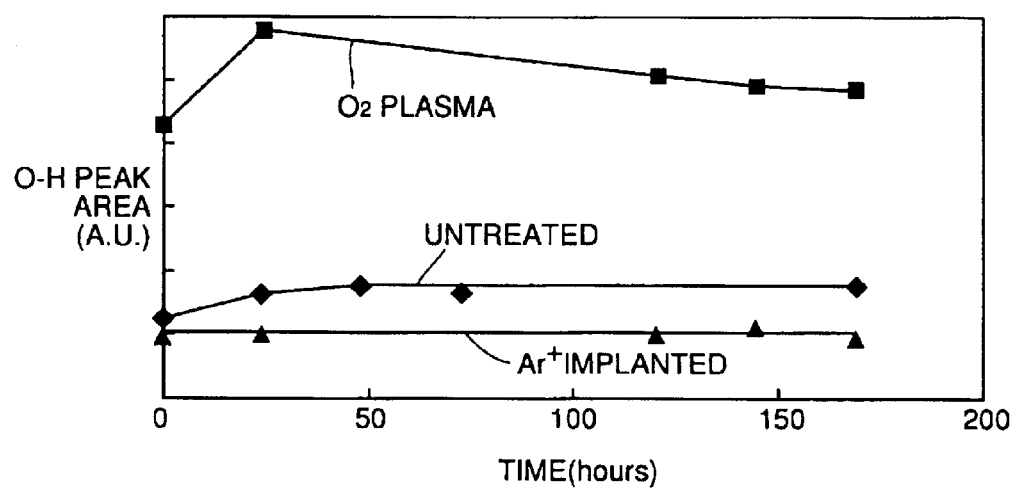
FIGS. 13–14 are diagrams of characteristics for describing an embodiment of the present invention, indicating the relationship between time and the O—H area.

FIG. 13 shows the evaluation result of the moisture in the films of an organic SOG film (untreated), an organic SOG film subjected to oxygen plasma (oxygen plasma process), and a modified SOG film (Ar ion implantation) left in the atmosphere of a clean room to observe the hygroscopicity of an organic SOG film and a modified SOG film. The amount of moisture in each film was indicated by the integrated intensity of the O—H group in the infrared absorption spectrum (in the vicinity of 3500 cm$^{-1}$) using the FT-IR method (Fourier Transform Infrared Spectroscopy). Ion implantation was carried out under the condition of an acceleration energy of 140 KeV and a dose of $1 \times 10^{15}$ atoms/cm$^2$.

It is appreciated that the moisture increases, not only before and after the treatment, but even after one day for the organic SOG film exposed to oxygen plasma. In contrast, the modified SOG film shows no increase in moisture after the ion implantation. Furthermore, the increase in moisture is smaller than that of the organic SOG film even when left in the atmosphere of a clean room. This means that the modified SOG film is less hygroscopic than the organic SOG film.

Figure 14:
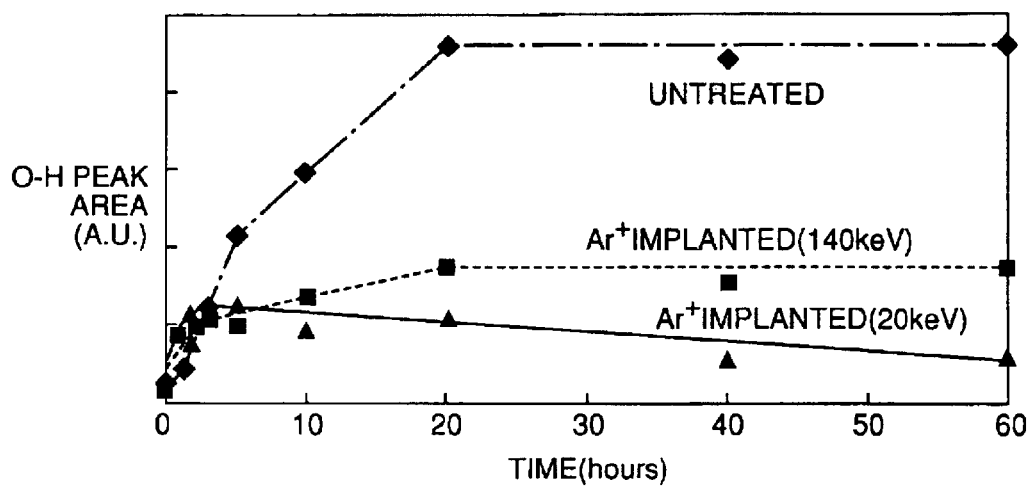

FIG. 14 shows the results of a pressure cooker test (PCT) carried out for the purpose of evaluating the moisture permeability of a modified SOG film and an organic SOG film. This PCT is a humidification test carried out in a saturated moisture atmosphere at 2 atmospheric pressure and 120° C. in the present embodiment. The integrated intensity of the absorption peak (in the vicinity of 3500 cm$^{-1}$) of the O—H group in the organic SOG film was obtained and plotted over the PCT time by means of the FT-IR method.

A specimen (Ar ion implantation: 20 KeV) having only the surface modified by ion implantation was prepared and compared with a specimen having the film entirely modified (Ar ion implantation: 140 KeV) and with a specimen that was not modified (organic SOG film: untreated). The following features were identified.

i) When an organic SOG film not modified is subjected to the PCT, the absorption intensity in the vicinity of 3500cm$^{-1}$ (absorption associated with O—H group) exhibited a drastic increase.

ii) With a modified SOG film, increase in the absorption intensity in the vicinity of 3500 cm$^{-1}$ (absorption associated with O—H group) is small. The increase in the specimen in which only the film surface is modified is substantially equal to that of the film that is thoroughly modified.

It is understood from the above results that a layer that suppresses moisture permeability can be formed by implanting ions.

Organic SOG films 3 and 7 are converted into modified SOG films 4 and 8, respectively, by introducing impurities by ion implantation into the organic SOG film, whereby moisture and hydroxyl group included in the film are reduced and exhibits less hygroscopicity. Also, the adhesion with silicon oxide film 2 adjacent to modified SOG film 4 is improved. An interlayer insulation film of high reliability can be obtained.

Second Embodiment

A method of fabricating a semiconductor device according to a second embodiment of the present invention will be described hereinafter with reference to FIGS. 15–20. The first to sixth steps (FIGS. 1–6) of the first embodiment are similarly employed in the second embodiment. Therefore, description thereof will not be repeated. Fabrication steps thereafter will be described. Components corresponding to those of the first embodiment have the same reference characters allotted, and detailed description thereof will not be repeated.

At the tenth step (refer to FIG. 15), a mask pattern 13 (silicon nitride film mask 13) formed of a silicon nitride film is provided on modified SOG film 8. Silicon nitride film mask 13 corresponds to the first mask pattern of the present invention.

At the eleventh step (refer to FIG. 16), an organic SOG film 14 of 600 nm in thickness is formed on modified SOG film 8 and silicon nitride film mask 13. The composition and fabrication method of organic SOG film 14 are similar to those of organic SOG film 3 already described. Organic SOG film 14 corresponds to the third insulation film of the present invention.

At the twelfth step (refer to FIG. 17) ions are implanted into organic SOG film 14 to form a modified SOG film 15. The composition and fabrication method of modified SOG film 15 are similar to those of the previously-described modified SOG film 4. Since organic SOG film 14 has substantially a uniform thickness over the entire face of the substrate, the entire organic SOG film 14 is modified substantially uniformly.

At the thirteenth step (refer to FIG. 18), a striped resist pattern 16 is formed on modified SOG film 15. The opening of resist pattern 16 includes the opening of silicon nitride film mask 13. The area of resist pattern 16 is larger than that of silicon nitride film mask 13. Resist pattern 16 corresponds to the second mask pattern of the present invention.

At the fourteenth step (refer to FIG. 19), anisotropic etching is carried out with resist pattern 16 as a mask using fluoro carbon gas as etching gas, whereby modified SOG films 15 and 8 are etched. Here, modified SOG film 15 is etched with an opening width identical to that of resist pattern 16. The etching process of modified SOG film 15 is stopped when arriving at silicon nitride film mask 13, whereby trenches 17a and 17b are formed in modified SOG film 15. Then, using silicon nitride film mask 13 as a mask, modified SOG film 8 is etched with an opening diameter identical to that of the mask. Contact holes 17c and 17d are formed communicating with metal interconnection 6 in modified SOG film 8.

By using silicon nitride film mask 13 as an etching stopper, trenches 17a and 17b and contact holes 17c and 17d can be formed by one etching process. Even when the position of the formed contact hole is deviated from the top face of metal interconnection 6 such as contact hole 17d due to mask misalignment so that modified SOG film 4 is exposed, contact error will not occur due to reasons similar to those for contact hole 9b.

At the fifteenth step (refer to FIG. 20), the interior of trenches 17a and 17b and contact holes 17c and 17d are cleaned by means of sputter etching using inert gas (for example, Ar). Then, a TiN film as an adhesion layer and a barrier layer is formed by magnetron sputtering or CVD on modified SOG film 15 including trenches 17a and 17b and contact holes 17c and 17d. A Cu film is formed thereon by CVD or plating. The surface of the Cu film is polished by CMP. Eventually, an interconnection 18 formed of TiN and Cu is embedded in trenches 17a and 17b and contact holes 17c and 17d.

Third Embodiment

A method of fabricating a semiconductor device according to a third embodiment of the present invention will be described hereinafter with reference to FIGS. 21–26. The first to sixth steps (FIGS. 1–6) of the first embodiment are employed in the present third embodiment. Description thereof will not be repeated and fabrication steps thereafter will be described. Components corresponding to those of the first and second embodiments have the same reference characters allotted, and detailed description thereof will not be repeated.

At the twentieth step (refer to FIG. 21), a resist pattern 20 is formed on modified SOG film 8 (film thickness is set to 1200 nm). The opening of resist pattern 20 includes the opening (metal interconnection 6) of trench 5. The area thereof is larger than that of trench 5.

At the twenty-first step (refer to FIG. 22), anisotropic etching is carried out with resist pattern 20 as a mask using fluoro carbon type gas as the etching gas. Modified SOG film 8 is etched to the thickness of 600 nm, whereby trenches 8a and 8b are formed in modified SOG film 8.

At the twenty-second step (refer to FIG. 23), resist pattern 20 is removed, and, then a resist pattern 21 is formed on modified SOG film 8. Opening 21a of resist pattern 21 is located within trenches 8a and 8b.

At the twenty-third step (refer to FIG. 24), anisotropic etching with resist pattern 21 as a mask is carried out using fluoro carbon type gas as the etching gas, whereby modified SOG film 8 is etched.

At the twenty-fourth step (refer to FIG. 25), trenches 8a and 8b and contact holes 22a and 22b communicating with metal interconnection 6 are formed in modified SOG film 8 by removing resist pattern 21. Even if a contact hole is formed deviated in position caused by mask misalignment in the formation of resist pattern 22 so that modified SOG film 4 is exposed, no contact error will occur by reasons similar to those for contact hole 9b.

At the twenty-fifth step (refer to FIG. 26), the interior of trenches 8a and 8b and contact holes 22a and 22b are cleaned by means of sputter etching using an inert gas (for example Ar). Then, a TiN film as an adhesion layer and a barrier layer is formed by magnetron sputtering or CVD on modified SOG film 8 including trenches 8a and 8b and contact holes 22a and 22b. A Cu film is formed thereon by CVD or plating. The surface of the Cu film is polished by CMP. Eventually, a connection hole interconnection 18 formed of TiN and Cu is embedded in contact holes 22a and 22b.

Fourth Embodiment

A method of fabricating a semiconductor device according to a fourth embodiment of the present invention will be described hereinafter with reference to FIGS. 27–33. The first to sixth steps (FIGS. 1–6) of the first embodiment are employed in the fourth embodiment. Therefore, description thereof will not be repeated. The fabrication steps thereafter will be described. Components corresponding to those of the second embodiment have the same reference characters allotted, and detailed description thereof will not be repeated.

At the thirtieth step (refer to FIG. 27), a resist pattern 30 is formed on modified SOG film 8.

At the thirty-first step (refer to FIG. 28), anisotropic etching is carried out with resist pattern 30 as a mask, using fluoro carbon type gas as the etching gas. As a result, contact holes 31a and 31b communicating with metal interconnection 6 are formed in modified SOG film 8.

At the thirty-second step (refer to FIG. 29), resist pattern 30 is removed. Then, a resist film 32 is applied on modified SOG film 8 including contact holes 31a and 31b.

At the thirty-third step (refer to FIG. 30), resist film 32 is patterned excluding the area where contact holes 31a and 31b are formed using the general exposure technique to form a resist pattern 33 on modified SOG film 8. Openings 33a and 33b of resist pattern 33 include contact holes 31a and 31b. The area thereof is greater than that of contact holes 31a and 31b.

At the thirty-fourth step (refer to FIG. 31), anisotropic etching is carried out with resist pattern 33 and resist film 32 remaining in contact holes 31a and 31b as a mask, using fluoro carbon type gas as the etching gas. Modified SOG film 8 is etched to ½ the film thickness. Thus, trenches 8a and 8b are formed in modified SOG film 8.

At the thirty-fifth step (refer to FIG. 32), trenches 8a and 8b and contact holes 31a and 31b communicating with metal interconnection 6 are formed in modified SOG film 8 by removing resist pattern 33 and resist film 32. Here, even if the position of a formed contact hole is deviated from the top face of metal interconnection 6 such as contact hole 31b to expose modified SOG film 4 due to misalignment in the formation of resist pattern 30, no contact error will occur due to reasons similar to those for contact hole 9b.

At the thirty-sixth step (refer to FIG. 33), the interior of trenches 8a and 8b and contact holes 31a and 31b are cleaned by means of sputter etching using inert gas (for example Ar). Then, a TiN film is formed as an adhesion layer and a barrier layer by sputtering or CVD. Then, a Cu film is formed by CVD or plating thereon. The surface of the Cu film is polished by CMP. Finally, a connection hole interconnection 18 formed of TiN and Cu is embedded in trenches 8a and 8b and contact holes 31a and 31b.

Fifth Embodiment

Figure 15:
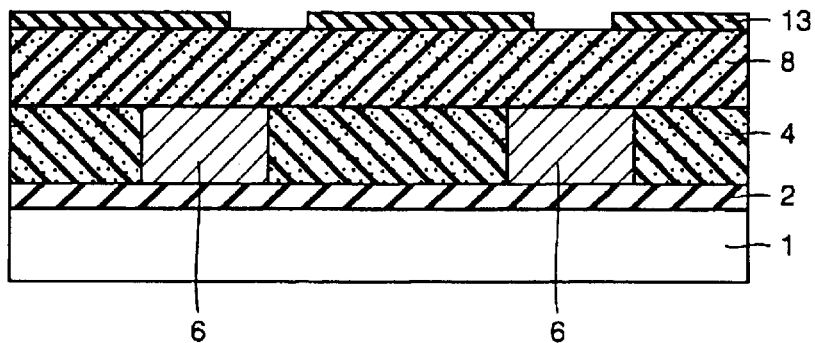
FIGS. 15–20 are schematic sectional views of a semiconductor device according to a second embodiment of the present invention indicating fabrication steps thereof
Figure 16:
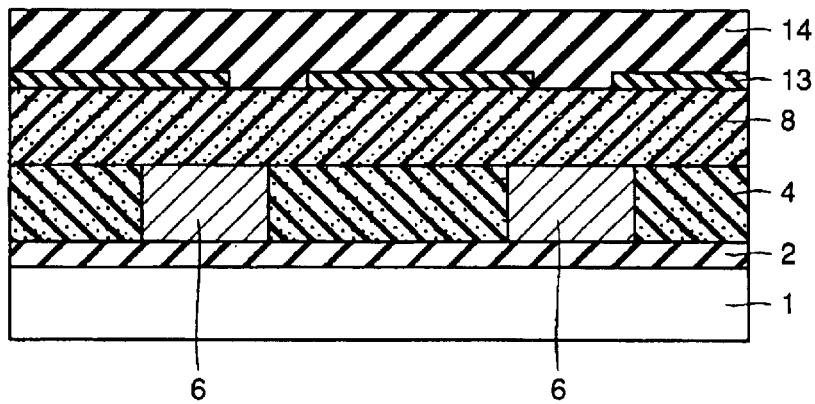
Figure 17:
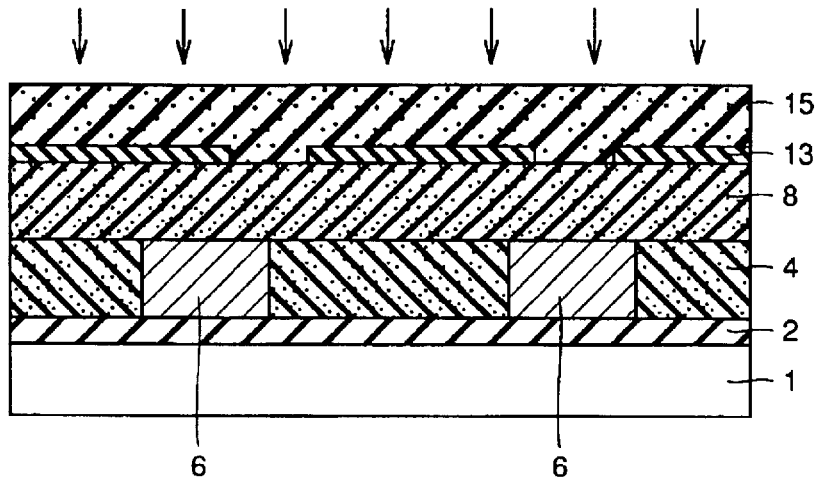
Figure 18:
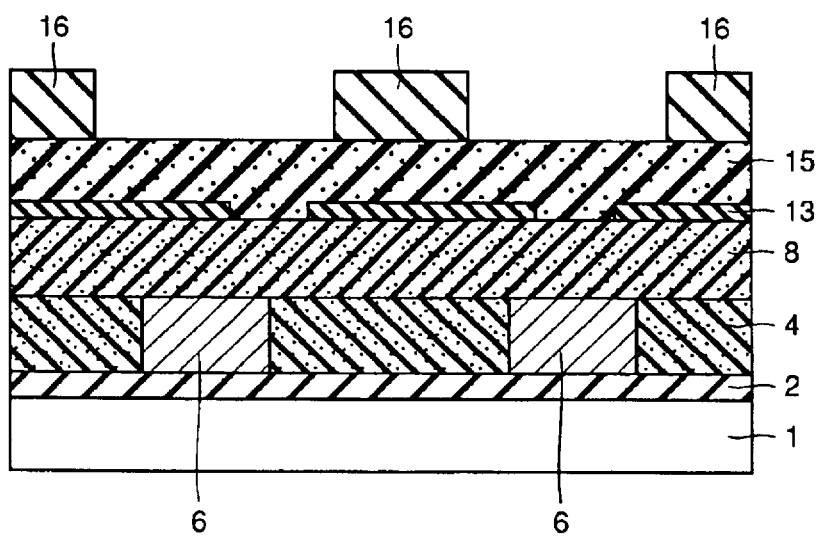
Figure 19:
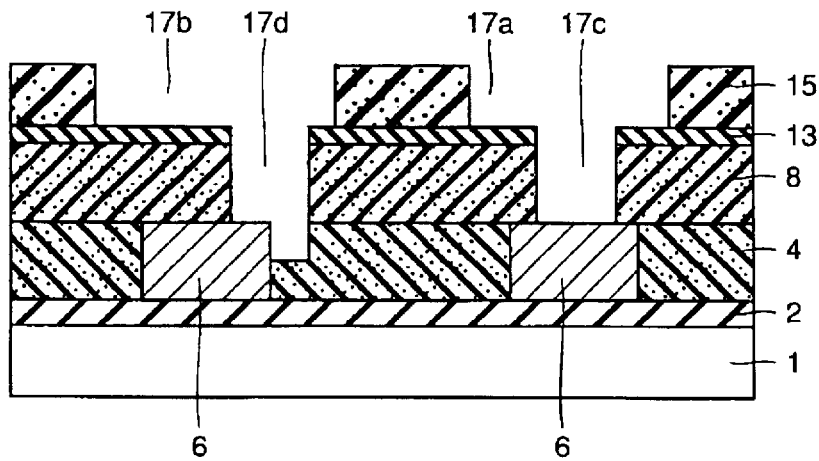
Figure 20:
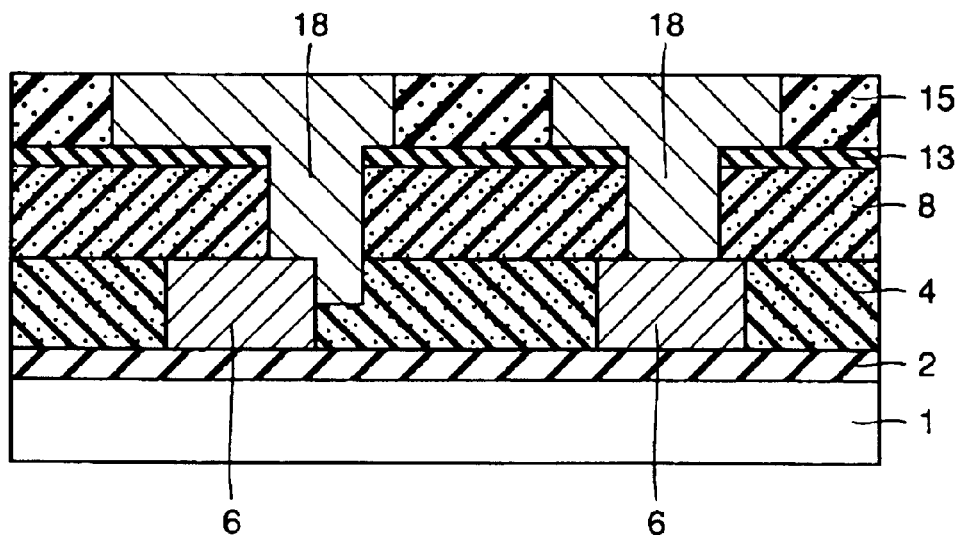
Figure 21:
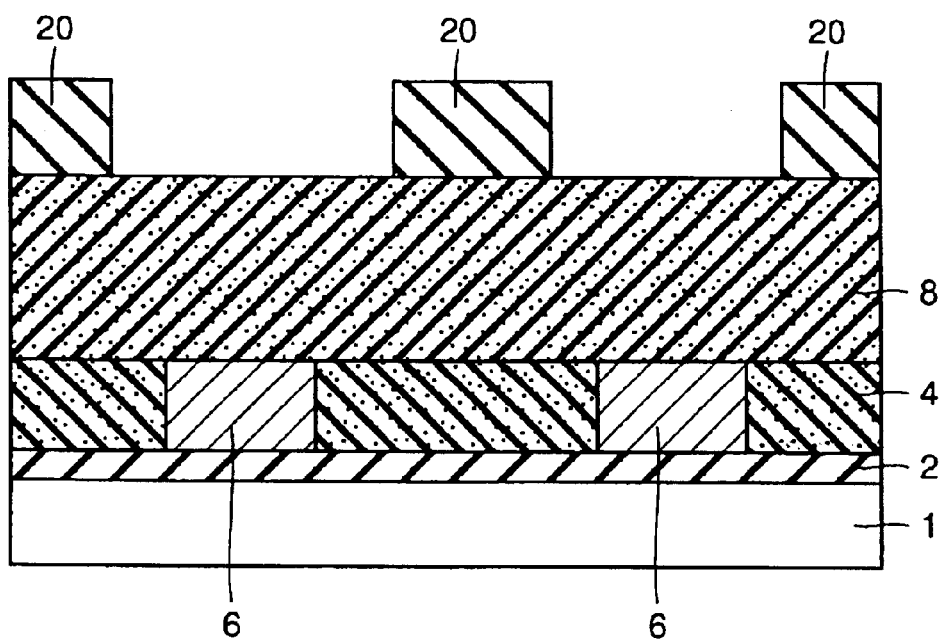
FIGS. 21–26 are schematic sectional views of a semiconductor device according to a third embodiment of the present invention indicating fabrication steps thereof.
Figure 22:
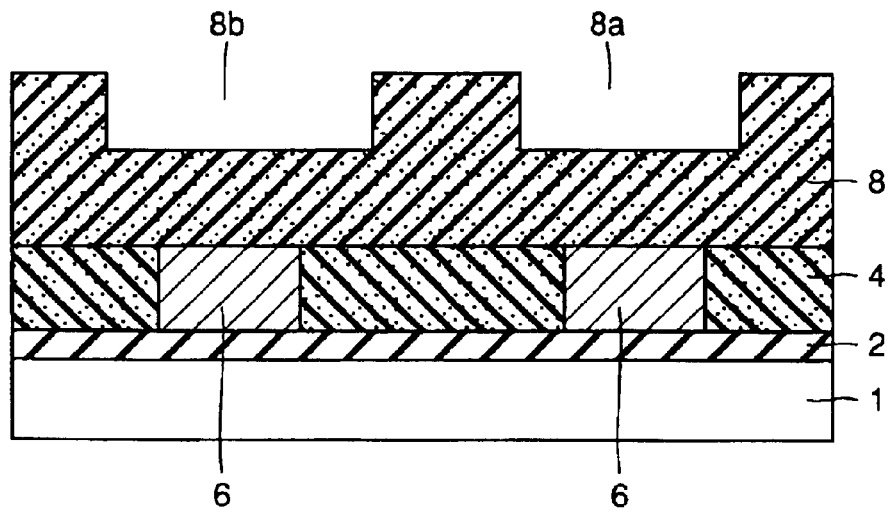
Figure 23:
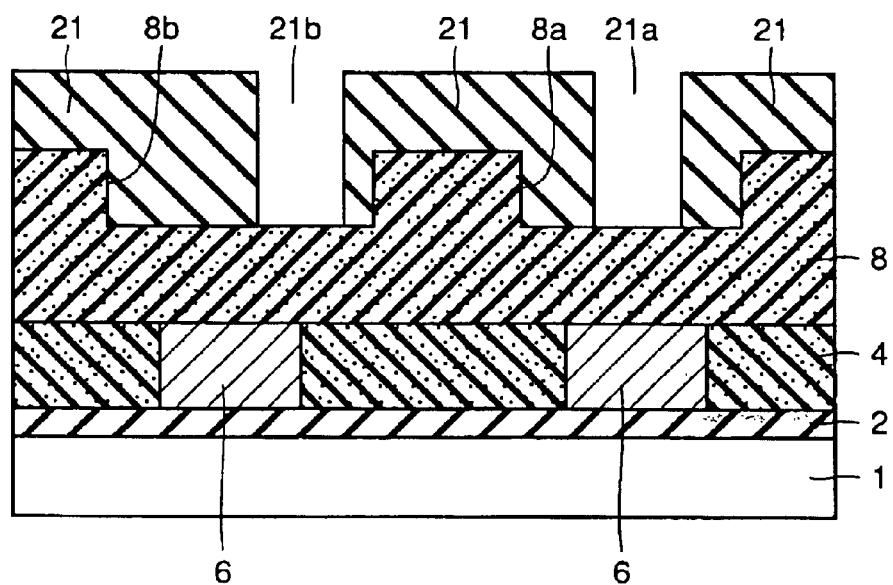
Figure 24:
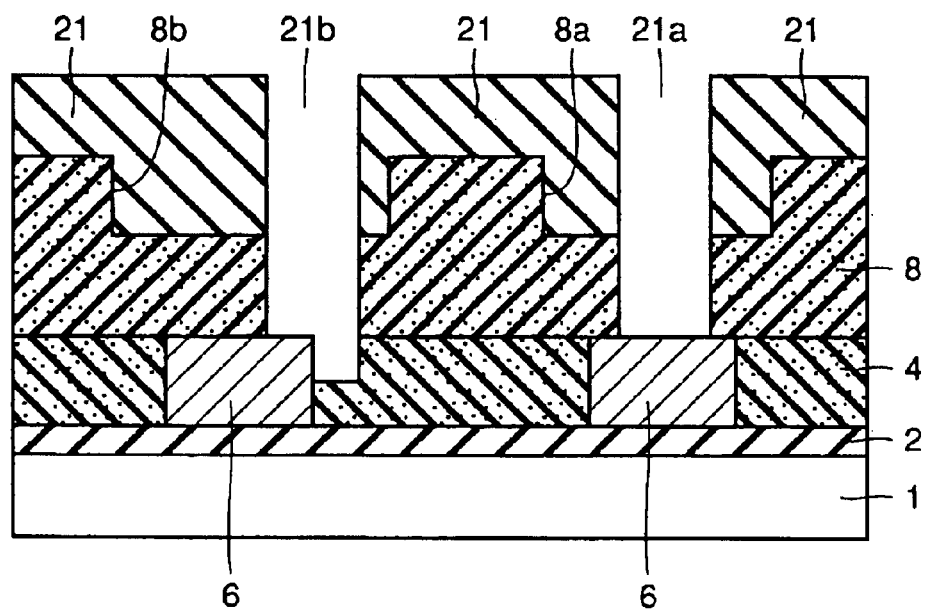
Figure 25:
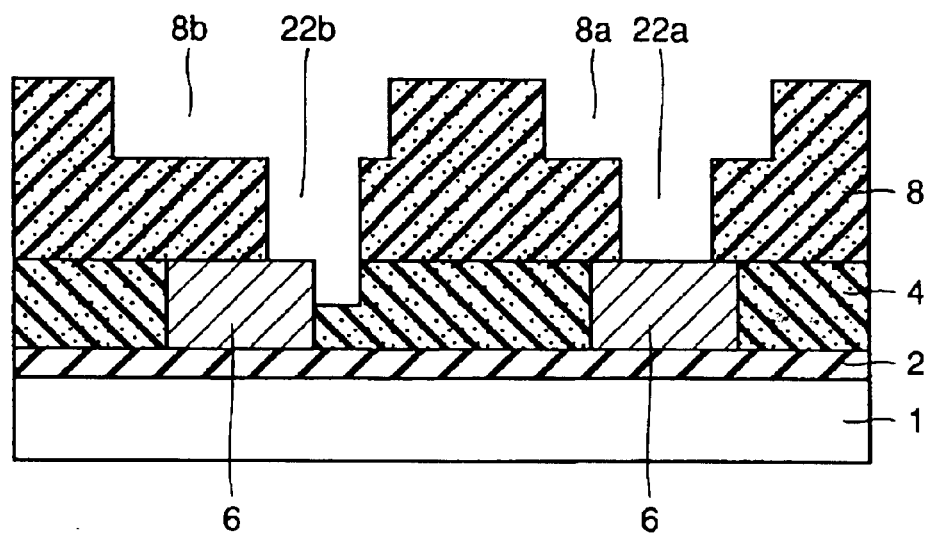
Figure 26:
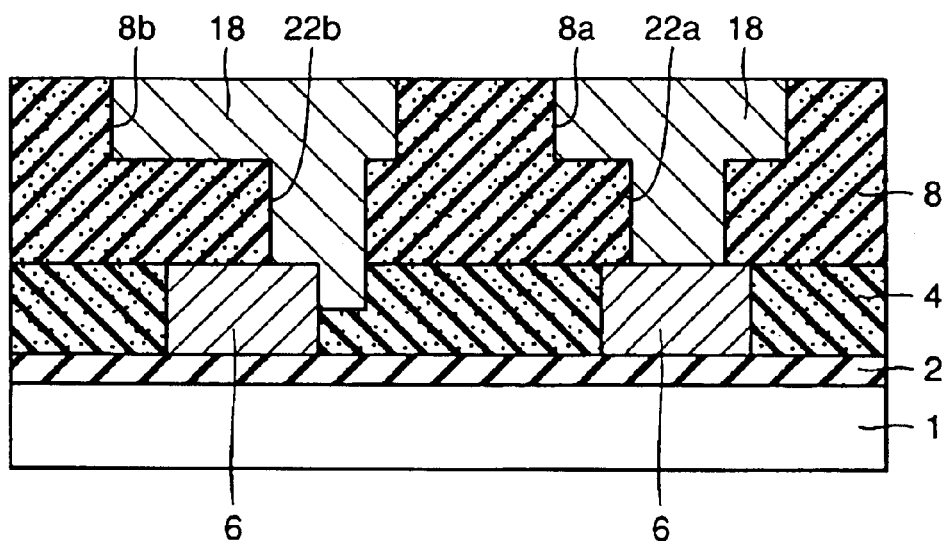
Figure 27:
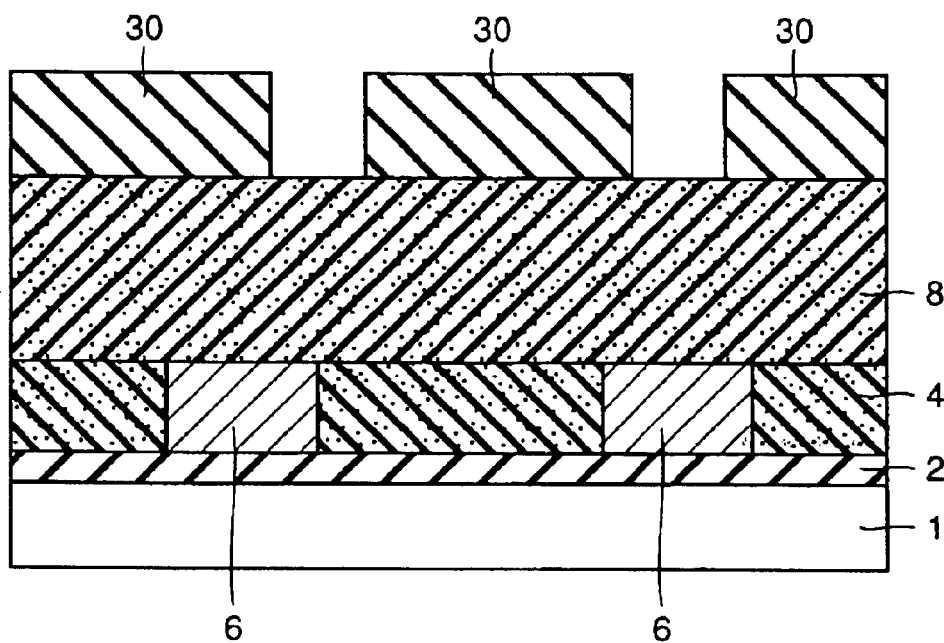
FIGS. 27–33 are schematic sectional views of a semiconductor device according to a fourth embodiment of the present invention indicating fabrication steps thereof.
Figure 28:
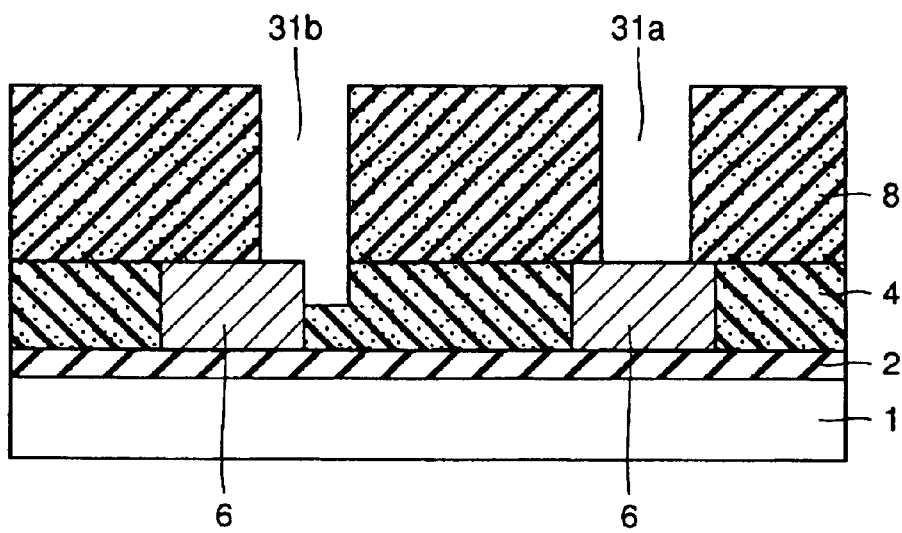
Figure 29:
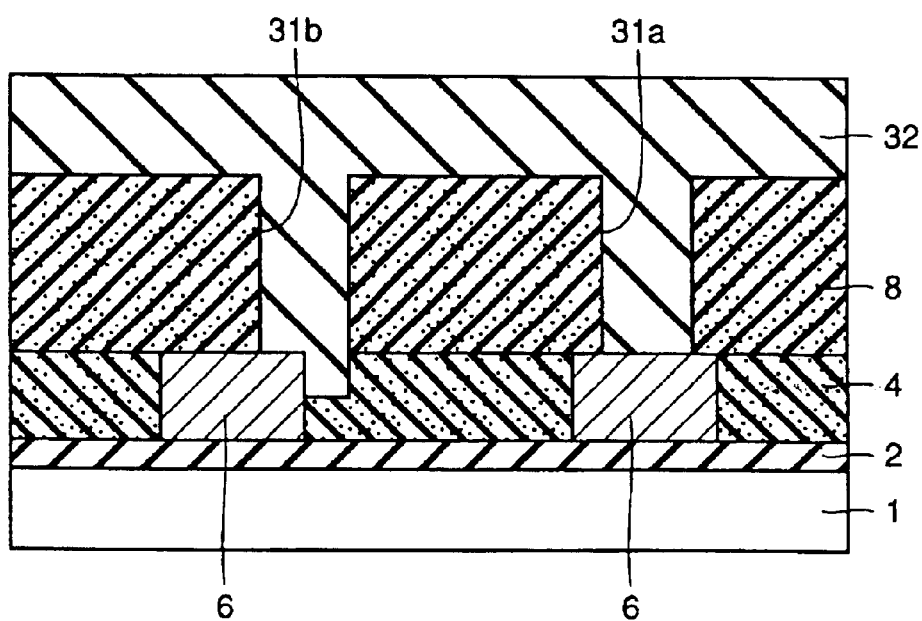
Figure 30:
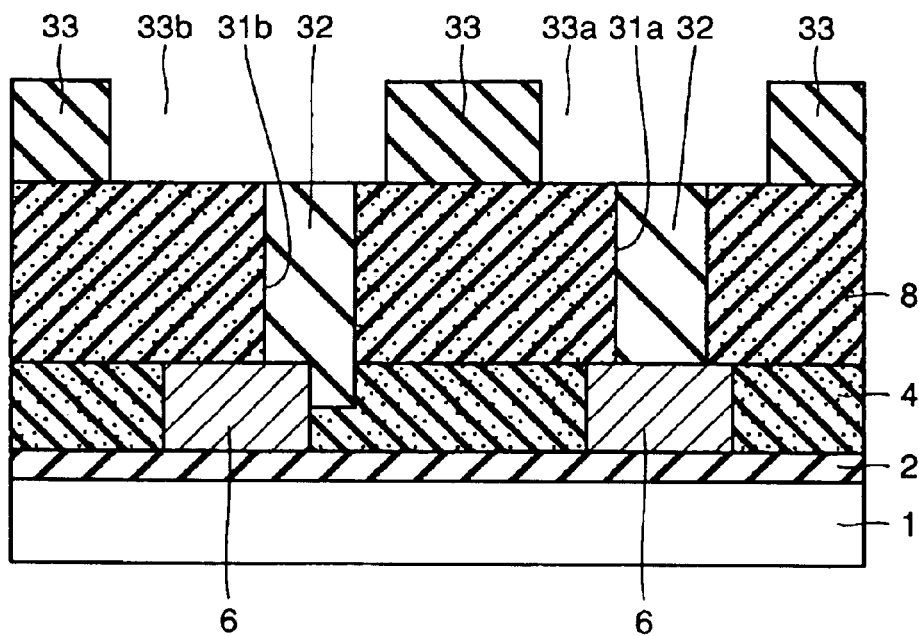
Figure 31:
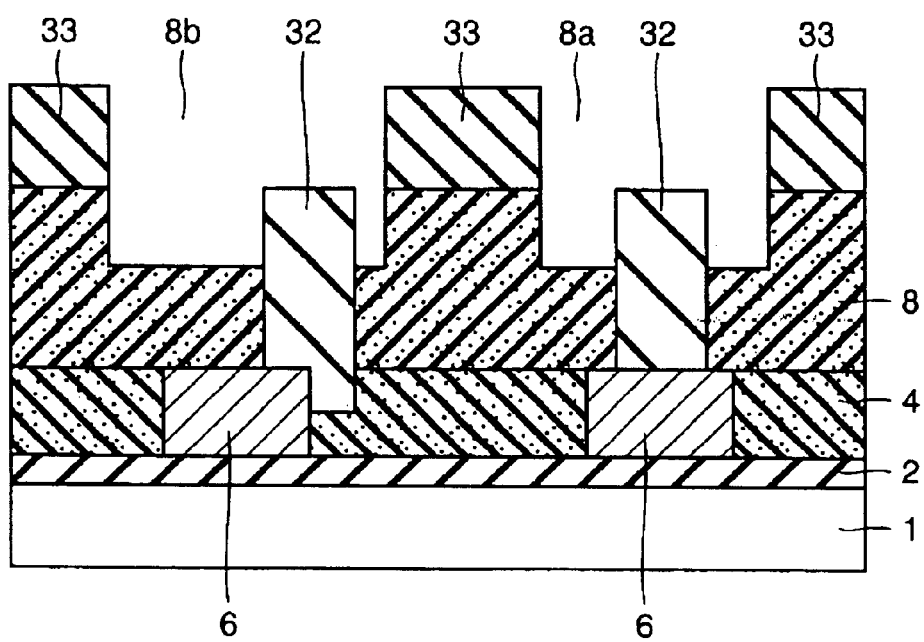
Figure 32:
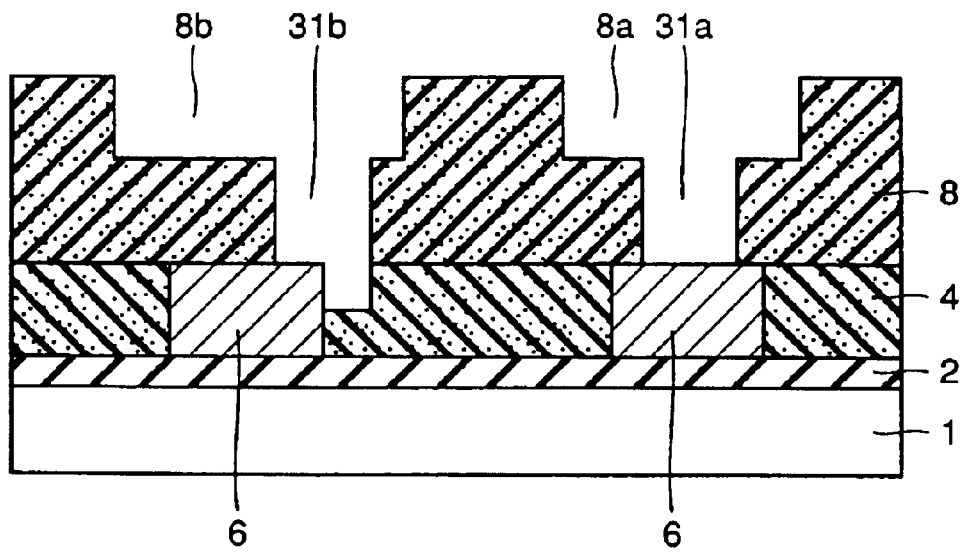
Figure 33:
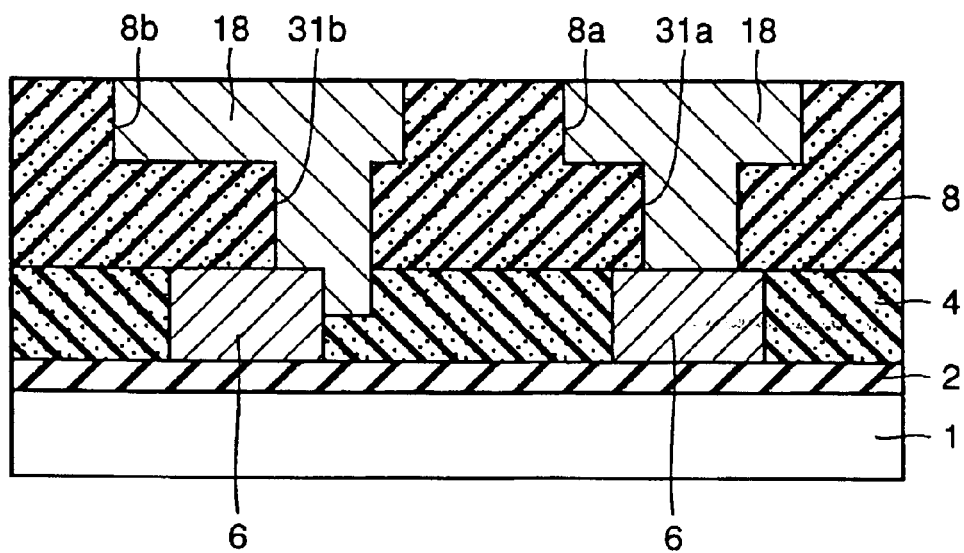
Figure 34:
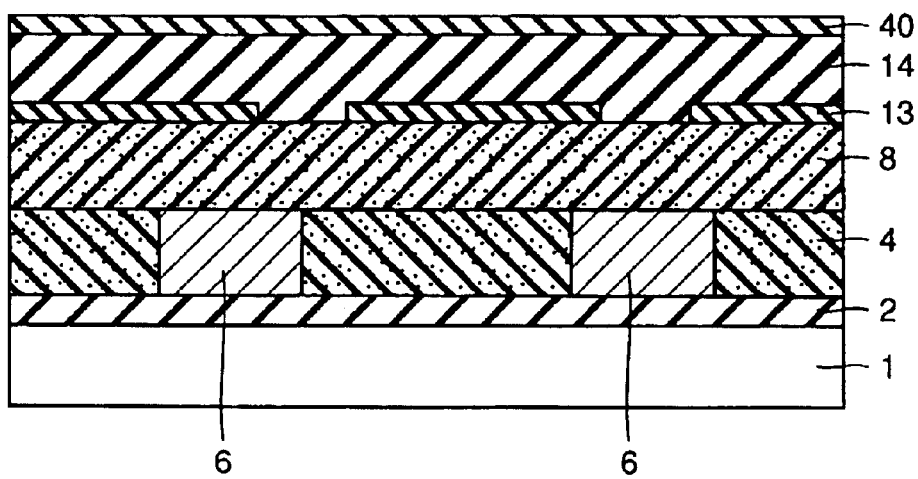
FIGS. 34–39 are schematic sectional views of a semiconductor device according to a fifth embodiment of the present invention indicating fabrication steps thereof.
Figure 35:
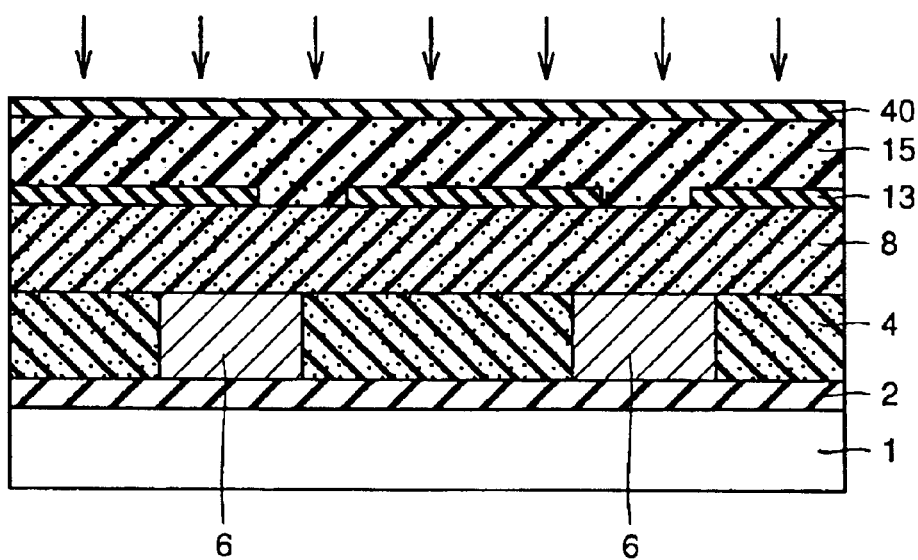
Figure 36:
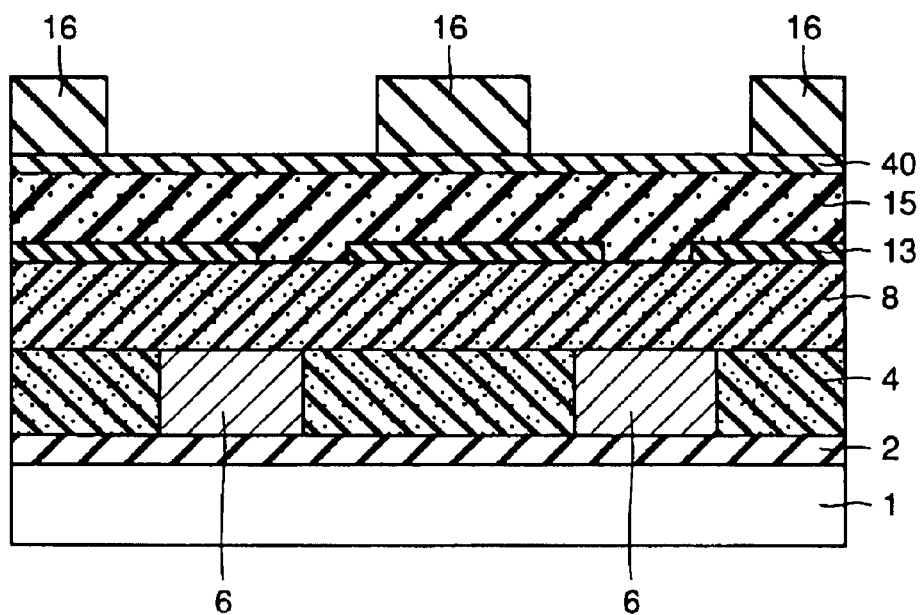
Figure 37:
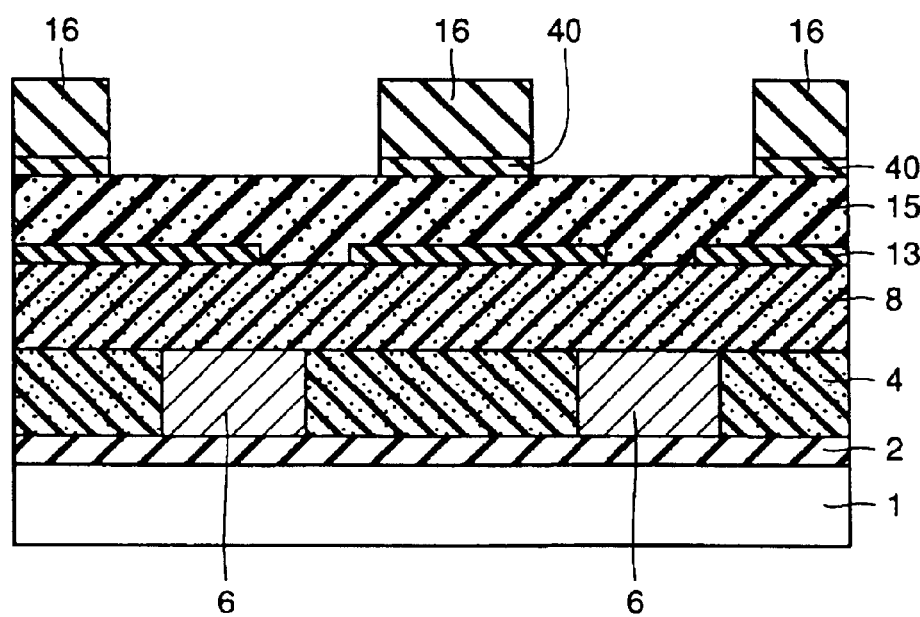
Figure 38:
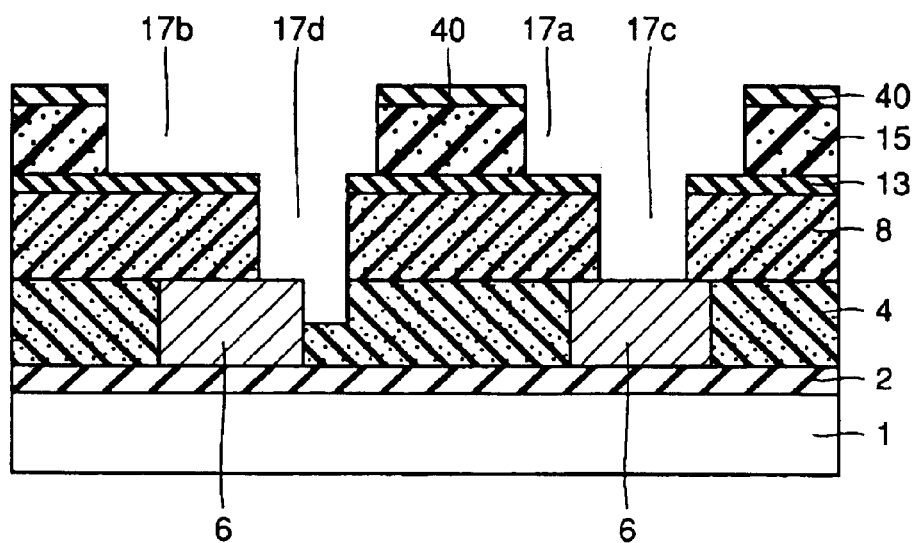
Figure 39:
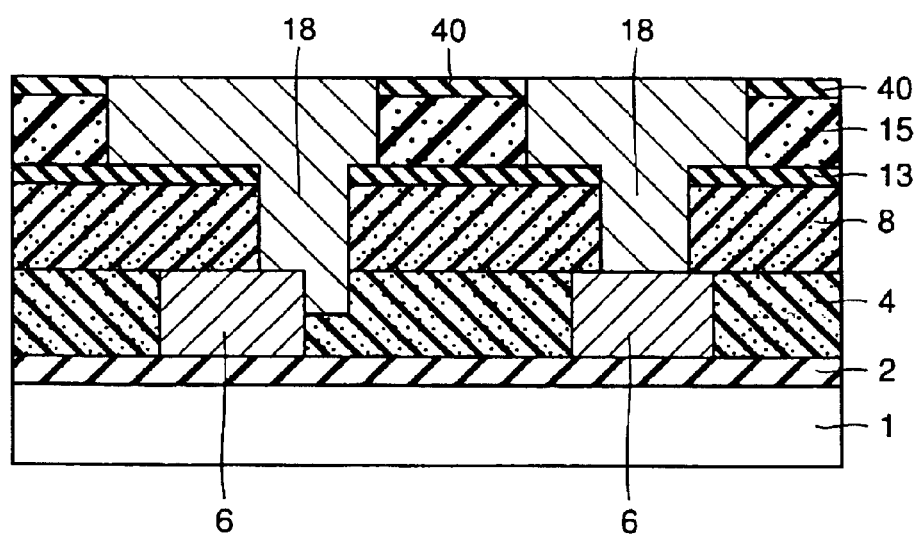

Following the steps shown in FIGS. 1–6 and the steps shown in FIGS. 15 and 16, the steps shown in FIGS. 34–39 are carried out in the fifth embodiment. Components corresponding to those of the previous embodiments have the same reference characters allotted, and description thereof will not be repeated.

At the thirty-seventh step (refer to FIG. 34), a silicon nitride film 40 is deposited all over organic SOG film 14.

At the thirty-eighth step (refer to FIG. 35), impurities are introduced into organic SOG film 14 by carrying out ion implantation from above silicon nitride film 40 to form a modified SOG film 15. Since organic SOG film 14 has substantially a uniform thickness all over the face of the substrate, the entire organic SOG film 14 is modified substantially uniformly.

At the thirty-ninth step (refer to FIG. 36), a striped resist pattern 16 is formed on silicon nitride film 40. The opening of resist pattern 16 is located upper than the opening of silicon nitride film mask 13. The area thereof is greater than that of silicon nitride film mask 13.

At the fortieth step (refer to FIG. 37), silicon nitride film 40 is patterned using resist pattern 16 as a mask.

At the forty-first step (refer to FIG. 38), resist pattern 16 is removed. Then, modified SOG film 15 and modified SOG film 8 are etched with the patterned silicon nitride film 40 as a mask. By this etching process, trenches 17a and 17b are formed in modified SOG film 15. Contact holes 17c and 17d communicating with metal interconnection 6 are formed in modified SOG film 8.

At the forty-second step (refer to FIG. 39), a TiN film is formed as an adhesion layer and a barrier layer by magnetron sputtering or CVD on silicon nitride film 40 including trenches 17a and 17b and contact holes 17c and 17d. A Cu film is formed thereon by CVD or plating. The surface of the Cu film is polished by CMP. Eventually, an interconnection 18 formed of TiN and Cu is embedded in trenches 17a and 17b and contact holes 17c and 17d.

The present invention is not limited to the above-described embodiments. Similar advantages can be achieved by implementation as set forth in the following.

(1) A fluoro carbon film, polyimide, or polyimide composed with siloxane can be used instead of the organic SOG film.

(2) The interconnection can be formed of aluminum, gold, silver, silicide, refractory metal, doped polysilicon, titanium nitride (TiN), titanium tungsten (TiW) or a layered structure thereof, instead of the Cu material.

(3) The TiN serving as an adhesion layer and a barrier layer can be formed of a layered structure of Ti, TaN, Ta, and the like. Alternatively, Ti, TaN, Ta can be used instead of TiN.

(4) The modified SOG film is subjected to a heat treatment. In this case, the hygroscopicity is further reduced since there are fewer dangling bonds in the modified SOG film. The moisture permeability is also reduced.

(5) The composition of the organic SOG film can be substituted with that of the inorganic SOG film represented by the aforementioned general formula (1), and implant ions into that inorganic SOG film. In this case, the moisture and hydroxyl group included in the inorganic SOG film can be reduced.

(6) Although boron ions are employed as the impurities to be implanted into the organic SOG film in the above embodiments, any ion may be used as long as the organic SOG film is eventually modified. Specifically, argon ions, boron ions, nitrogen ions and the like that have a relatively small mass are suitable. Particularly, boron ions are most suitable. Sufficient effect can be expected from other ions enumerated in the following.

Inert gas ions (such as helium ion, neon ion, krypton ion, xenon ion and radon ion) can be used. Since inert gas does not react with the organic SOG film, there is no probability of adverse influence by ion implantation.

Element unitary ions in each group of III b, IV b, V b, VI b and VII b, and compound ions thereof can also be used. Particularly, the element unitary ions and compound ions of oxygen, aluminum, sulfur, chlorine, gallium, germanium, arsenic, selenium, bromine, antimony, iodine, indium, tin, tellurium, lead, and bismuth can be used. Particularly, metal element ions can suppress the dielectric constant of the organic SOG film subjected to ion implantation.

Also, element unitary ions of the groups IVa, Va and compound ions thereof can be used. Particularly, element unitary ions of titanium, vanadium, niobium, hafnium, and tantalum, and compound ions thereof can be used. Since the dielectric constant of oxides of the elements of the groups IVa and Va is high, the dielectric constant of the organic SOG film subjected to ion implantation will increase. However, this is of no particular problem in practice except for the case where an interlayer insulation film of a low dielectric constant is required.

A plurality of the types of the above-described ions can be used in combination. In this case, a further superior effect can be obtained by the synergism of each ion.

(7) In the above-described embodiments, ions are implanted into the organic SOG films. The present invention is not limited to ions, and atoms, molecules, or particles can be introduced. (In the present invention, they are generically referred to as "impurities").

(8) Sputtering is not limited to magnetron sputtering. Diode sputtering, radio frequency sputtering, tetrode sputtering and the like can be employed.

(9) The sputter etching method can be carried out without using inert gas. For example, reactive ion beam etching (RIBE: also called reactive ion milling) using reactive gas (for example, $CCl_4$, $SF_6$) can be used.

(10) As an alternative to the single crystal silicon substrate (semiconductor substrate), a conductive substrate or an insulative substrate such as glass can be used. Although the above-described embodiments show the case where an interconnection is formed on a single crystal silicon substrate, the present invention is also applicable to a device such as a LCD that has the interconnection formed on an insulative substrate. It is understood that the concept of "semiconductor device" of the present invention includes a device having an interconnection formed on an insulative substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A fabrication method of a semiconductor device comprising the steps of:
    forming a first insulation layer on a substantially flat underlying face over a substrate,
    introducing impurities into said first insulation layer, and embedding and forming a first conductive layer in said first insulation layer by the Damascene method, and
    forming a fourth insulation layer on said substrate prior to formation of said first insulation layer.

2. The fabrication method of a semiconductor device according to claim 1, wherein said step of forming a first conductive layer includes the step of embedding the first conductive layer in said first insulation layer so as to expose a surface of said first conductive layer, and
    said fabrication method further comprising the steps of:
    forming a second insulation layer on said first insulation layer;
    forming a contact hole in said second insulation layer, exposing a portion of said first conductive layer; and
    forming a second conductive layer in said contact hole, electrically connected to said first conductive layer.

3. The fabrication method of a semiconductor device according to claim 2, further comprising the step of introducing impurities into said second insulation layer.

4. The fabrication method of a semiconductor device according to claim 2, comprising, after formation of said second insulation layer and before formation of said contact hole, the steps of:
    forming a first mask pattern on said second insulation layer;
    forming a third insulation layer on said second insulation layer and on said first mask pattern,
    forming a second mask pattern on said third insulation layer, having an opening larger than said first mask pattern, and
    etching said third insulation layer using said second mask pattern to form a trench in said third insulation layer reaching to said first mask pattern,
    wherein said step of forming a contact hole includes the step of etching said second insulation layer using said first mask pattern, and
    wherein said step of forming a second conductive layer includes the step of forming a third conductive layer in said trench, electrically connected to said second conductive layer, in addition to formation of said second conductive layer.

5. The fabrication method of a semiconductor device according to claim 4, further comprising the step of introducing impurities into said third insulation layer.

6. The fabrication method of a semiconductor device according to claim 4, wherein said third insulation layer includes a silicon oxide film containing at least 1% carbon.

7. The fabrication method of a semiconductor device according to claim 1, wherein said first insulation layer includes a silicon oxide film containing at least 1% of carbon.

8. The fabrication method of a semiconductor device according to claim 2, wherein said second insulation layer includes a silicon oxide film containing at least 1% of carbon.

9. The fabrication method of a semiconductor device according to claim 1,
wherein said step of introducing impurities into the first insulation layer is carried out under a condition where introduced impurities arrive at an interface between said first insulation layer and said fourth insulation layer.

10. The fabrication method of a semiconductor device according to claim 1, wherein said first insulation layer includes an inorganic SOG film.

11. The fabrication method of a semiconductor device according to claim 2, further comprising after formation of said second insulation layer and before formation of said contact hole, the steps of:
forming a mask pattern on said second insulation layer,
etching said second insulation layer using said mask pattern to selectively reduce thickness of said second insulation layer, and
forming another mask pattern on said second insulation layer so as to expose a portion of the region reduced in thickness,
wherein said step of forming a contact hole includes the step of etching said second insulation layer using said another mask pattern, and
said step of forming a second conductive layer includes the step of forming a third conductive layer on said region reduced in thickness, electrically connected to said second conductive layer, in addition to formation of said second conductive layer.

12. The fabrication method of a semiconductor device according to claim 1, further comprising the steps of:
forming a second insulation layer on said first insulation layer,
forming a fifth mask pattern on said second insulation layer,
etching said second insulation layer using said fifth mask pattern to form a contact hole in said second insulation layer, exposing a portion of said first conductive layer,
after removing said fifth mask pattern, forming a resist film in said contact hole and on said second insulation layer,
forming a sixth mask pattern on said contact hole, having an opening larger than that contact hole, by patterning said resist film on said second insulation layer,
etching said second insulation layer using said sixth mask pattern to selectively reduce thickness of said second insulation layer,
removing the resist film remaining in said contact hole and said sixth mask pattern, and
forming a second conductive layer in said contact hole, electrically connected to said first conductive layer.

13. The fabrication method of a semiconductor device according to claim 2, further comprising the step of introducing impurities into said second insulation layer, prior to forming said contact hole in said second insulation layer.

14. The fabrication method according to claim 1, wherein said first conductive layer is embedded only in said first insulation layer.

15. A fabrication method of a semiconductor device comprising the steps of:
forming a first insulation layer on a substantially flat underlying face over a substrate,
introducing impurities into said first insulation layer,
forming a trench in said first insulation layer by etching,
embedding and forming a first conductive layer in said first insulation layer,
forming a second insulation layer on said flat first insulation layer and said flat first conductive layer,
introducing impurities into said second insulation layer,
forming a trench and a contact hole in said first insulation layer by etching,
embedding and forming a second conductive layer in said second insulation layer.

* * * * *